(12) United States Patent
Hsu et al.

(10) Patent No.: US 8,536,614 B2
(45) Date of Patent: Sep. 17, 2013

(54) NITRIDE SEMICONDUCTOR LIGHT EMITTING DEVICE WITH MAGNETIC FILM

(75) Inventors: Chih-Hao Hsu, Hsinchu (TW); Rong Xuan, New Taipei (TW); Yu-Hsiang Chang, Hsinchu County (TW); Jung-Chun Huang, Tainan (TW); Chun-Ying Chen, Taichung (TW)

(73) Assignees: Industrial Technology Research Institute, Hsinchu (TW); National Cheng-Kung University, Tainan (TW)

( * ) Notice: Subject to any disclaimer, the term of this patent is extended or adjusted under 35 U.S.C. 154(b) by 91 days.

(21) Appl. No.: 13/339,388

(22) Filed: Dec. 29, 2011

(65) Prior Publication Data
US 2012/0098024 A1  Apr. 26, 2012

Related U.S. Application Data

(63) Continuation-in-part of application No. 12/815,432, filed on Jun. 15, 2010, which is a continuation-in-part of application No. 12/146,418, filed on Jun. 25, 2008, now Pat. No. 7,767,996, and a continuation-in-part of application No. 12/117,747, filed on May 9, 2008, now Pat. No. 7,906,786, said application No. 12/146,418 is a continuation-in-part of application No. 12/117,747, filed on May 9, 2008, now Pat. No. 7,906,786.

(60) Provisional application No. 61/020,397, filed on Jan. 11, 2008.

(51) Int. Cl.
*H01L 33/00* (2010.01)

(52) U.S. Cl.
USPC  257/99; 257/103; 257/E33.001; 257/E33.064; 257/E33.066

(58) Field of Classification Search
USPC ........ 257/94, 98, 99, 103, E33.001, E33.064, 257/E33.066
See application file for complete search history.

(56) References Cited

U.S. PATENT DOCUMENTS

| 4,450,460 A | 5/1984 | Morimoto |
|---|---|---|
| 5,874,749 A | 2/1999 | Jonker |

(Continued)

FOREIGN PATENT DOCUMENTS

| JP | 09-219564 | 8/1997 |
|---|---|---|
| JP | 1996-203768 | * 8/2009 |

(Continued)

OTHER PUBLICATIONS

Chen et al., "Effects of spin-polarized injection and photoionization of MnZnO film on GaN-based lightemitting diodes", vol. 18, No. 3 / Optics Express 2302, Feb. 1, 2010, p. 1-7.

(Continued)

*Primary Examiner* — David S Blum
(74) *Attorney, Agent, or Firm* — Jianq Chyun IP Office

(57) ABSTRACT

A nitride semiconductor light emitting device including an n-type nitride semiconductor layer, a p-type nitride semiconductor layer, a light emitting semiconductor layer, a first metal pad, a second metal pad, and a first magnetic material layer is provided. The light emitting semiconductor layer is disposed between the n-type nitride semiconductor layer and the p-type nitride semiconductor layer. The first metal pad is electrically connected to the n-type nitride semiconductor layer. The second metal pad is electrically connected to the p-type nitride semiconductor layer. The first magnetic material layer is disposed between the first metal pad and the n-type nitride semiconductor layer. A distribution area of the first magnetic material layer parallel to a (0001) plane of the n-type nitride semiconductor layer is greater than or equal to an area of the first metal pad parallel to the (0001) plane.

30 Claims, 14 Drawing Sheets

(56) References Cited

U.S. PATENT DOCUMENTS

| | | | |
|---|---|---|---|
| 6,043,515 | A | 3/2000 | Kamiguchi et al. |
| 6,621,100 | B2 | 9/2003 | Epstein et al. |
| 6,858,866 | B2 | 2/2005 | Chen |
| 7,301,174 | B1 | 11/2007 | Popovich |
| 7,767,996 | B2 | 8/2010 | Xuan et al. |
| 7,858,991 | B2 | 12/2010 | Xuan et al. |
| 7,906,786 | B2 * | 3/2011 | Xuan et al. ............ 257/79 |
| 7,989,818 | B2 | 8/2011 | Xuan et al. |
| 8,243,769 | B2 * | 8/2012 | Furushima et al. ........ 372/50.12 |
| 2005/0018725 | A1 | 1/2005 | Nurmikko |
| 2005/0207165 | A1 | 9/2005 | Shimizu et al. |
| 2005/0221527 | A1 | 10/2005 | Yeh et al. |
| 2005/0238076 | A1 | 10/2005 | Kuwata et al. |
| 2006/0186432 | A1 | 8/2006 | Osipov et al. |
| 2006/0256825 | A1 | 11/2006 | Matsumura et al. |

FOREIGN PATENT DOCUMENTS

| | | |
|---|---|---|
| TW | 201103161 | 1/2011 |
| TW | 201106783 | 2/2011 |

OTHER PUBLICATIONS

Kuo et al., "Enhanced Light Output of AlGaInP Light Emitting Diodes Using an Indium-Zinc Oxide Transparent Conduction Layer and Electroplated Metal Substrate", The Japan Society of Applied Physics, Applied Physics Express 4, 2011 pp. 012101-1 to 012101-3.

Sheu et al., "Ga-Doped ZnO Transparent Conductive Oxide Films Applied to GaN-Based Light-Emitting Diodes for Improving Light Extraction Efficiency", IEEE Journal of Quantum Electronics, vol. 44, No. 12, December 2008, pp. 1211-1218.

Mares et al., "Hybrid CdZnO/GaN quantum-well light emitting diodes", Published in: J. Appl. Phys. 104, 093107 (2008) / DOI 10.1063/1.3013446, pp. 1-7.

Itskos et al., "Oblique Hanle measurements of InAs/GaAs quantum dot spin-light emitting diodes", Applied Physics Letters 88, 2006, pp. 022113-1 to 022113-3.

Sze, "Semiconductor Devices. Physics and Technology", 2002, Jon Willey & Sons, pp. 291-292.

Dunkin et al., "Handbook of Optoelectronics. vol. 1", 2006, Informa, Taylor & Francis Group, pp. 358-359.

Arakawa et al., "Two-Dimensional Quantum-Mechanical Confinement of Electrons in LED by Strong Magnetic Fields ", IEEE Transactions on Electron Devices, vol. ED-30, No. 4, Apr. 1983, pp. 330-334.

Denbaars, "Gallium-Nitride-Based Materials for Blue to Ultraviolet Optoelectronics Devices", 1997, Proceedings of IEEE, vol. 85, No. 11, pp. 1740-1749.

* cited by examiner (a)

(b)

(c)

US 8,536,614 B2

NITRIDE SEMICONDUCTOR LIGHT EMITTING DEVICE WITH MAGNETIC FILM

CROSS-REFERENCE TO RELATED APPLICATION

This application is a continuation in part (CIP) application of and claims the priority benefit of U.S. application Ser. No. 12/815,432, filed on Jun. 15, 2010. The prior application Ser. No. 12/815,432 is a CIP application of and claims the priority benefit of U.S. application Ser. No. 12/146,418, filed on Jun. 25, 2008, now U.S. Pat. No. 7,767,996 and U.S. application Ser. No. 12/117,747, filed on May 9, 2008, now U.S. Pat. No. 7,906,786. The prior application Ser. No. 12/146,418 is a CIP application and claims the priority benefit of U.S. application Ser. No. 12/117,747. The prior application Ser. No. 12/117,747 claims the priority benefit of U.S. provisional application Ser. No. 61/020,397, filed on Jan. 11, 2008. The entirety of each of the above-mentioned patent applications is hereby incorporated by reference herein and made a part of this specification.

BACKGROUND OF THE INVENTION

1. Technical Field

The disclosure is related to a light emitting device. More particularly, the disclosure is related to a nitride semiconductor light emitting device.

2. Background

Distinct from regular fluorescent lamps or incandescent lamps that generate heat to emit light, semiconductor light emitting devices such as light emitting diodes (LEDs) adopt the specific property of semiconductor to emit light, in which the light emitted by the light emitting devices is referred to as cold luminescence. The light emitting devices have advantages of long service life, light weight, and low power consumption, such that the light emitting devices have been employed in a wide variety of applications, such as optical displays, traffic lights, data storage apparatus, communication devices, illumination apparatus, and medical treatment equipment.

In recent years, environmental consciousness prevails in many countries, and people start to place importance on how to conserve energy. In order to conserve energy, using an electronic device with high energy efficiency is one of good options, which less adversely affect the convenience of daily life and still effectively conserve energy. Accordingly, how to improve the light emitting efficiency of light emitting devices is an important issue in this art.

However, the technology of LEDs is mature nowadays, and the degree of the improvement of light efficiency of LEDs by conventional techniques is highly limited.

SUMMARY

An embodiment of the disclosure provides a nitride semiconductor light emitting device including an n-type nitride semiconductor layer, a p-type nitride semiconductor layer, a light emitting semiconductor layer, a first metal pad, a second metal pad, and a first magnetic material layer. The light emitting semiconductor layer is disposed between the n-type nitride semiconductor layer and the p-type nitride semiconductor layer. The first metal pad is electrically connected to the n-type nitride semiconductor layer. The second metal pad is electrically connected to the p-type nitride semiconductor layer. The first magnetic material layer is disposed between the first metal pad and the n-type nitride semiconductor layer. A distribution area of the first magnetic material layer parallel to a (0001) plane of the n-type nitride semiconductor layer is greater than or equal to an area of the first metal pad parallel to the (0001) plane.

An embodiment of the disclosure provides a nitride semiconductor light emitting device including an n-type nitride semiconductor layer, a p-type nitride semiconductor layer, a light emitting semiconductor layer, a first metal pad, a second metal pad, and a first magnetic material layer. The light emitting semiconductor layer is disposed between the n-type nitride semiconductor layer and the p-type nitride semiconductor layer. The first metal pad is electrically connected to the n-type nitride semiconductor layer. The second metal pad is electrically connected to the p-type nitride semiconductor layer. The first magnetic material layer is disposed between the second metal pad and the p-type nitride semiconductor layer. A distribution area of the first magnetic material layer parallel to a (0001) plane of the n-type nitride semiconductor layer is greater than or equal to an area of the second metal pad parallel to the (0001) plane.

An embodiment of the disclosure provides a nitride semiconductor light emitting device including an n-type nitride semiconductor layer, a p-type nitride semiconductor layer, a light emitting semiconductor layer, a first metal pad, a second metal pad, and a magnetic material layer. The light emitting semiconductor layer is disposed between the n-type nitride semiconductor layer and the p-type nitride semiconductor layer. The first metal pad is electrically connected to the n-type nitride semiconductor layer. The second metal pad is electrically connected to the p-type nitride semiconductor layer. The magnetic material layer is disposed between the second metal pad and the p-type nitride semiconductor layer. A distribution area of the magnetic material layer parallel to a (0001) plane of the n-type nitride semiconductor layer is greater than or equal to an area of the second metal pad parallel to the (0001) plane.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
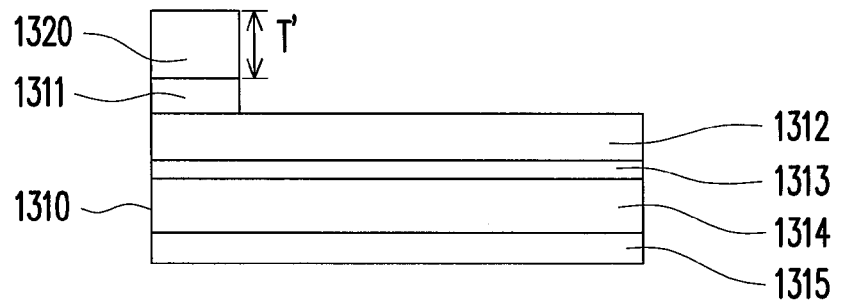
FIG. 1(a)~FIG. 1(c) are cross-sectional diagrams illustrating structures of a light emitting device according to embodiments of the disclosure.
Figure 1:
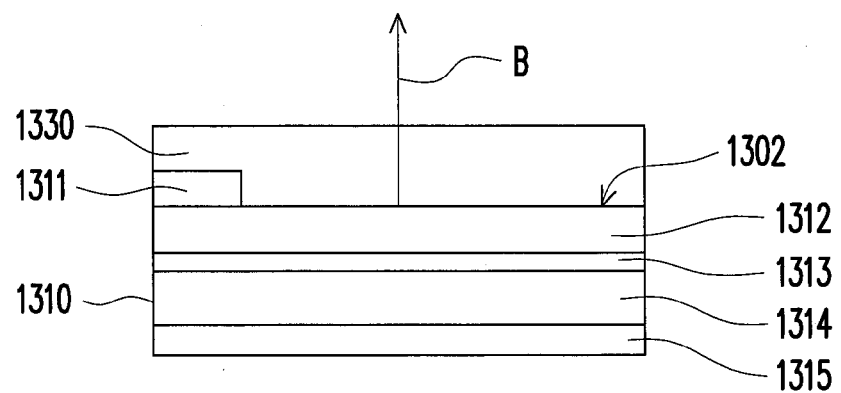
Figure 1:
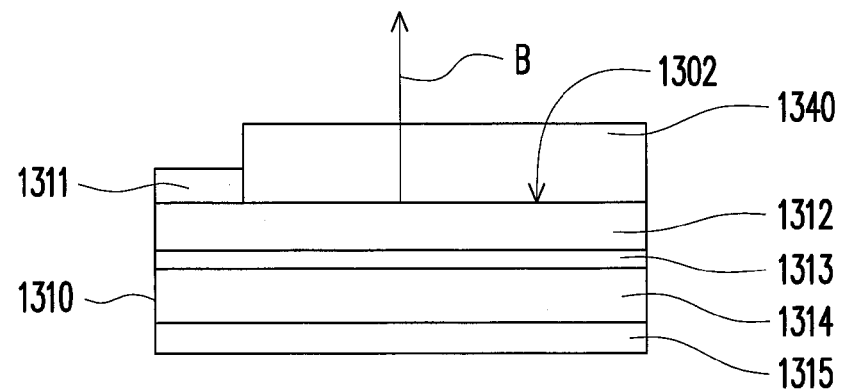

FIG. 1(a)–FIG. 1(c) are cross-sectional diagrams illustrating structures of a light emitting device according to embodiments of the disclosure. Referring to FIG. 1(a), the light emitting device 1300a of the present embodiment is a vertical type LED, which includes a light emitting chip 1310 and a magnetic material 1320. The light emitting chip 1310 includes, from top to bottom, a first electrode 1311, a first doped layer 1312, an active layer 1313, a second doped layer 1314, and a second electrode 1315, in which the first doped layer 1312, the active layer 1313, and the second doped layer 1314 form a light emitting stacking layer. In this embodiment, the first doped layer 1312 is a p-type semiconductor layer, the second doped layer 1314 is an n-type semiconductor layer, and the active layer 1313 includes multiple quantum wells or a single quantum well. However, in other embodiments, the first doped layer 1312 may be a p-type semiconductor layer, and the second doped layer 1314 may be an n-type semiconductor layer. The first electrode 1311 is disposed on the first doped layer 1312 and electrically coupled to the first doped layer 1312, and the second electrode 1315 is disposed under the second doped layer 1314 and electrically coupled to the second doped layer 1314, so as to form a vertical type LED structure. The active layer 1313 is disposed between first electrode 1311 and the second electrode 1315, and capable of generating light when a current flows through it.

The magnetic material 1320 is disposed on the first electrode 1311 and exerts a magnetic field on the light emitting chip 1310, such that the main distribution of current density in the light emitting chip 1310 is moved from an area between the first electrode 1311 and the second electrode 1315 to an area under the light-out plane, so as to enhance the current homogeneity and increase an overall brightness of the light emitting device 1300a. In this embodiment, the thickness T' of the magnetic material 1320 in a direction perpendicular to the active layer 1313 is larger than 1 millimeter.

In other embodiments, the magnetic material may be disposed on the light emitting stacking layer and covers the first electrode (magnetic material 1330, as shown in FIG. 1(b)), or disposed on a surface of the light emitting stacking layer uncovered by the first electrode (magnetic material 1340, as shown in FIG. 1(c)). In FIGS. 1(b) and 1(c), each of the magnetic material 1330 and 1340 is a magnetic film covering the light emitting surface 1302 of the semiconductor stack structure, and light B emitted from the active layer 1313 passes through the light emitting surface 1302 and the magnetic film and is then transmitted to the outside of the light emitting device 1300b, 1300c.

As for a LED having a horizontal type structure and having a magnetic material disposed thereon, the light emitting device 1300a in FIG. 1(a) may be modified to a horizontal type structure. That is to say, the first electrode 1311 and the second electrode 1315 may be disposed on the same side of the stack structure of the first doped layer 1312, the active layer 1313, and the second doped layer 1314. Specifically, a part of the top surface of the second doped layer 1314 is not covered by the active layer 1313 and the first doped layer 1312, and the second electrode 1315 is disposed on the part of the top surface of the second doped layer 1314 not covered by the active layer 1313.

In other embodiments, the magnetic material may be disposed on the light emitting stacking layer and covers the first electrode, or disposed on a surface of the light emitting stacking layer uncovered by the first electrode. In yet other embodiments, the magnetic material may be disposed on the second electrode (not shown), which is not limited thereto.

In addition, when a magnetic material layer is disposed between a semiconductor layer and an electrode (e.g. a metal pad) in a nitride semiconductor light emitting device, the light efficiency of the nitride semiconductor light emitting device is increased, which is evidenced by experiments.

Figure 2A:
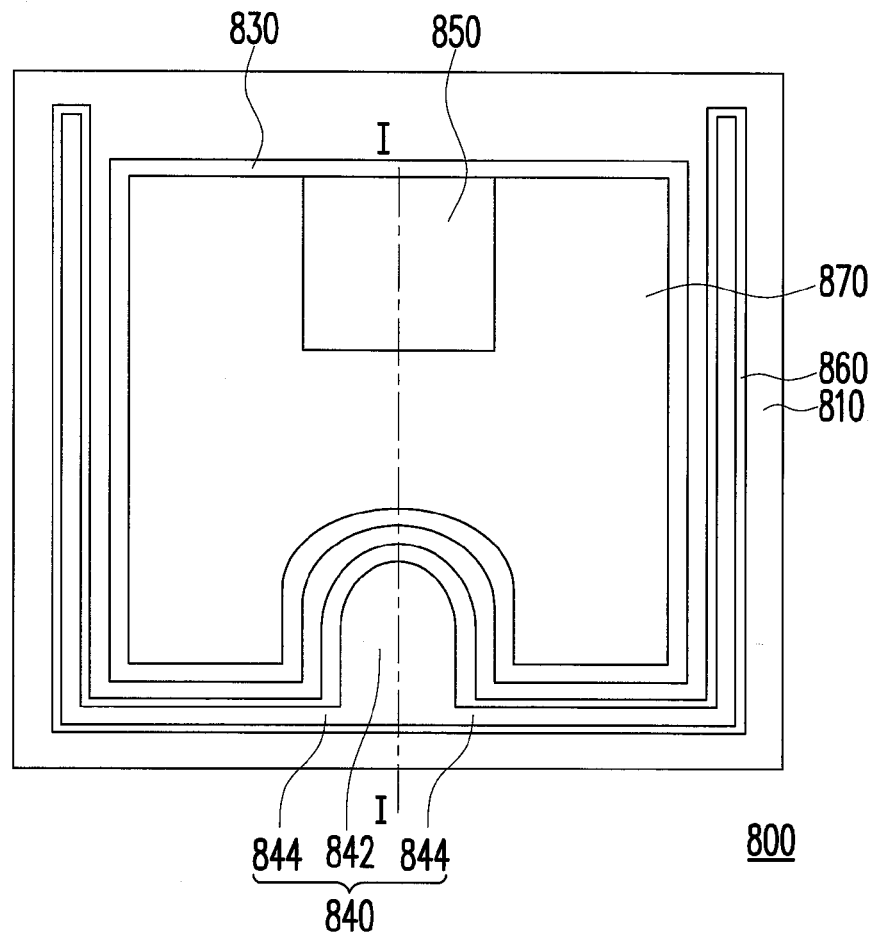
FIG. 2A is a schematic top view of a nitride semiconductor light emitting device according to an exemplary embodiment.
Figure 2B:
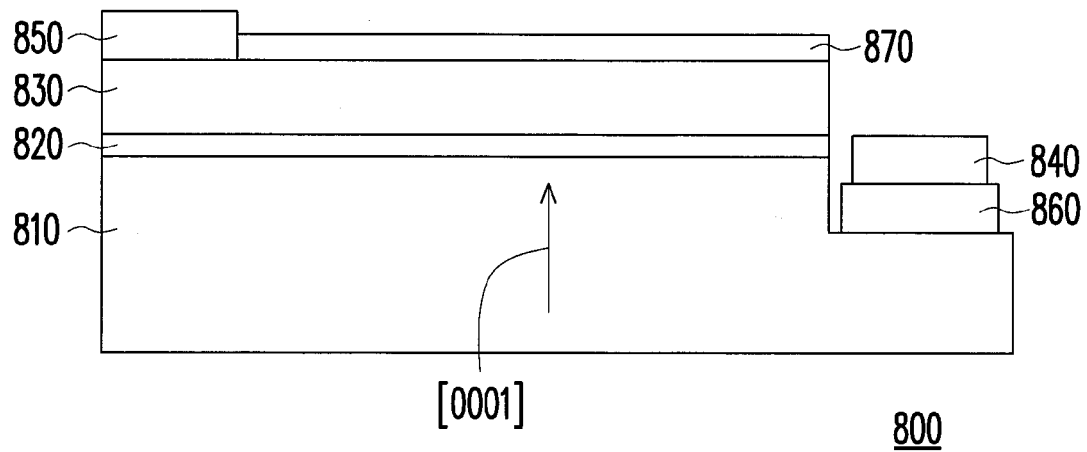
FIG. 2B is a schematic cross-sectional view of the nitride semiconductor light emitting device in FIG. 2A along line I-I.

FIG. 2A is a schematic top view of a nitride semiconductor light emitting device according to an exemplary embodiment, and FIG. 2B is a schematic cross-sectional view of the nitride semiconductor light emitting device in FIG. 2A along line I-I. Referring to FIGS. 2A and 2B, a nitride semiconductor light emitting device 800 in this embodiment includes an n-type nitride semiconductor layer 810, a p-type nitride semiconductor layer 830, a light emitting semiconductor layer 820, a first metal pad 840, a second metal pad 850, and a first magnetic material layer 860. The light emitting semiconductor layer 820 is disposed between the n-type nitride semiconductor layer 810 and the p-type nitride semiconductor layer 830. In this embodiment, the material of the n-type nitride semiconductor layer 810 is, for example, n-type GaN, the material of the p-type nitride semiconductor layer 830 is, for example, p-type GaN, and the light emitting semiconductor layer 820 includes, for example, multiple quantum well layers or a single quantum well layer.

The first metal pad 840 is electrically connected to the n-type nitride semiconductor layer 810. The second metal pad 850 is electrically connected to the p-type nitride semiconductor layer 830. In this embodiment, the first metal pad 840 is disposed on the n-type nitride semiconductor layer 810, and the second metal pad 850 is disposed on the p-type nitride semiconductor layer 830. Moreover, in this embodiment, the nitride semiconductor light emitting device 800 is, for example, a horizontal type light emitting diode (LED). That is to say, in this embodiment, the first metal pad 840 and the second metal pad 850 are disposed on the same side of a semiconductor stack structure formed by the n-type nitride semiconductor layer 810, the light emitting semiconductor layer 820, and the p-type nitride semiconductor layer 830.

The first magnetic material layer 860 is disposed between the first metal pad 840 and the n-type nitride semiconductor layer 810, and the first metal pad 840 is electrically connected to the n-type nitride semiconductor layer 810 through the first magnetic material layer 860. In an embodiment, the material of the first magnetic material layer includes a magnetic element doped compound. The magnetic element includes a transition metal, a rare earth element, or a combination thereof, and the compound includes $CuAlO_2$, $CuGaO_2$, $AgInO_2$, $SrCu_2O_2$, $Cd_2SnO_4$, $In_2O_3$, $TiO_2$, $Cu_2O$, $ZnO$, $SnO_2$, $CdO$, $ZnO$, $MnSe$, $ZnSe$, $CdSe$, $MgSe$, $ZnTe$, $MnTe$, $MgTe$, $CdTe$, $CdS$, $ZnS$, $HgS$, $HgSe$, $HdTe$, $NiO$, $MnO$, $GaN$, $InN$, $AlN$, $InAs$, $GaAs$, $AlAs$, $GaP$, $InP$, $GaSb$, $AlSb$, $InSb$, $Si$, $Ge$, $SiGe$, $SiC$, graphene, carbon nanotubes, bucky balls, $Bi_2Te_3$, $Bi_2Se_3$, $Sb_2Te_3$, $Sb_2Se_3$, yttrium barium copper oxide (YBCO), bismuth strontium calcium copper oxide (BSCCO), HgBaCaCuO (HBCCO), FeAs, SmFeAs, CeFeAs, LaFeAs, MgB, or a combination thereof, wherein the rare earth element includes Pr, Nd, Sm, Gd, Dy, or a combination thereof.

In another embodiment, the material of the first magnetic material layer 860 includes Co, Fe, Ni, Mn, NiFe, CoFe, CoFeB, SmCo, NdFeB, $\Omega FeN$ ($\Omega$ represents Ce, Pr, Nd, Sm, Eu, Tb, Dy, Ho, Er, Tm, or Yb), $\Omega FeC$ ($\Omega$ represents Ce, Pr, Nd, Sm, Eu, Tb, Dy, Ho, Er, Tm, or Yb), $CrO_2$, $Fe_3O_4$, $La_{1-x}\Phi_xMn$ ($\Phi$ represents Ca, Ba, or Sr, and x is about 0.3), $\Psi_2\Delta\Sigma O_6$ ($\Psi$ represents Ca, Sr, or B, $\Delta$ represents Co or Fe, and $\Sigma$ represents Mo or Re), GdN, NiMnSb, PtMnSb, $Fe_{1-x}Co_xSi$ (x is greater than 0 and less than 1), $Fe_2CrSi$, $Co_2MnSi$, $Fe_2\Theta Si$ ($\Theta$ represents Cr, Mn, Fe, Co, or Ni), $Cr_2O_3$, $TbMnO_3$, $HoMn_2O_5$, $HoLuMnO_3$, $YMnO_3$, $DyMnO_3$, $LuFe_2O_4$, $BiFeO_3$, $BiMnO_3$, $BaTiO_3$, $PbVO_3$, $PrMnO_3$, $CaMnO_3$, $K_2SeO_4$, $Cs_2CdI_4$, $BaNiF_4$, $ZnCr_2Se_4$ combination thereof. The English abbreviations of the materials hereinbefore and hereinafter are chemical symbols except for those the full names of which are recited, and each of the Greek letters of the materials hereinbefore represents any one of some possible chemical symbols. For example, $\Psi_2\Delta\Sigma O_6$ may be $Ca_2CoMoO_6$, $Sr_2CoMoO_6$, $B_2CoMoO_6$, $Ca_2FeMoO_6$, $Sr_2FeMoO_6$, $B_2FeMoO_6$, $Ca_2CoReO_6$, $Sr_2CoReO_6$, $B_2CoReO_6$, $Ca_2FeReO_6$, $Sr_2FeReO_6$, or $B_2FeReO_6$.

In this embodiment, the material of the first magnetic material layer 860 is Co doped ZnO, and the doping concentration of Co in ZnO ranges from 2.5% to 20% by mole ratio. For instance, the doping concentration of Co in ZnO is 5% or 7% by mole ratio. However, in other embodiments, the material of the first magnetic material layer 860 may include Mn doped ZnO or a combination of Co doped ZnO and Mn doped ZnO.

The distribution area of the first magnetic material layer 860 parallel to a (0001) plane of the n-type nitride semiconductor layer 810 is greater than or equal to an area of the first metal pad 840 parallel to the (0001) plane. The "(0001)" are Miller indices. In this embodiment, the n-type semiconductor layer 810, the light emitting semiconductor layer 820, and the p-type nitride semiconductor layer 830 are grown along a [0001] direction, wherein the "[0001]" are Miller indices and represent the direction perpendicular to the (0001) plane. That is to say, the (0001) plane is substantially parallel to the interface between the n-type semiconductor layer 810 and the light emitting semiconductor layer 820.

In this embodiment, the thickness of the first magnetic material layer 860 in a direction (i.e. the [0001] direction) perpendicular to the (0001) plane ranges from 20 nanometer (nm) to 1 micrometer (μm). For example, the thickness of the first magnetic material layer 860 in the direction perpendicular to the (0001) plane is 120 nm. Moreover, in this embodiment, the distribution area of the first magnetic material layer 860 parallel to the (0001) plane of the n-type nitride semiconductor layer 810 is greater than or equal to an area of the second metal pad 850 parallel to the (0001) plane. Additionally, in this embodiment, the magnetic polarization direction of the first magnetic material layer 860 is about parallel to the (0001) plane.

In view of the energy band structure, the conduction band of ZnO and the conduction band of n-type GaN form a conduction band offset in the interface between the ZnO and the n-type GaN, and the conduction band offset is about 0.15 eV. If a dopant or some dopants is doped in ZnO (for example, the material of the first magnetic material layer 860 is Co doped ZnO), the energy band structure and the quantity of free electrons are changed, so that the conduction band offset is eliminated. As a result, the conductivity between the first metal pad 840 and the n-type nitride semiconductor layer 810 in this embodiment is increased and higher than the conductivity between a metal pad and an n-type GaN layer wherein the metal pad directly contacts with the n-type GaN layer. Moreover, if the material of the metal pad is a Ti series metal, and if the metal pad directly contacts with the n-type GaN layer, TiN is generated in the interface between the metal pad and the n-type GaN layer, and TiN reduces the conductivity. However, in this embodiment, if the first metal pad 840 is a Ti series metal, $TiO_2$ is generated between the first metal pad 840 and the n-type nitride semiconductor layer 810. Since $TiO_2$ has good electrical conductivity, the conductivity between the first metal pad 840 and the n-type nitride semiconductor layer 810 is good.

Moreover, in this embodiment, the first metal pad 840 has a bonding portion 842 and at least one finger portion 844 (a plurality of finger portions 844 are shown in FIG. 2A for example) connected to the bonding portion 842. A bonding wire or a bump may be bonded to the bonding portion 842, and the finger portion 844 is extended along at least one direction parallel to the (0001) plane. Furthermore, in this embodiment, the nitride semiconductor light emitting device 800 further includes a transparent conductive layer 870 disposed on the p-type nitride semiconductor layer 830 and physically and electrically connected with the second metal pad 850. In this embodiment, the material of the transparent conductive layer 870 is, for example, indium tin oxide (ITO) or another transparent conductive material.

Figure 3A:
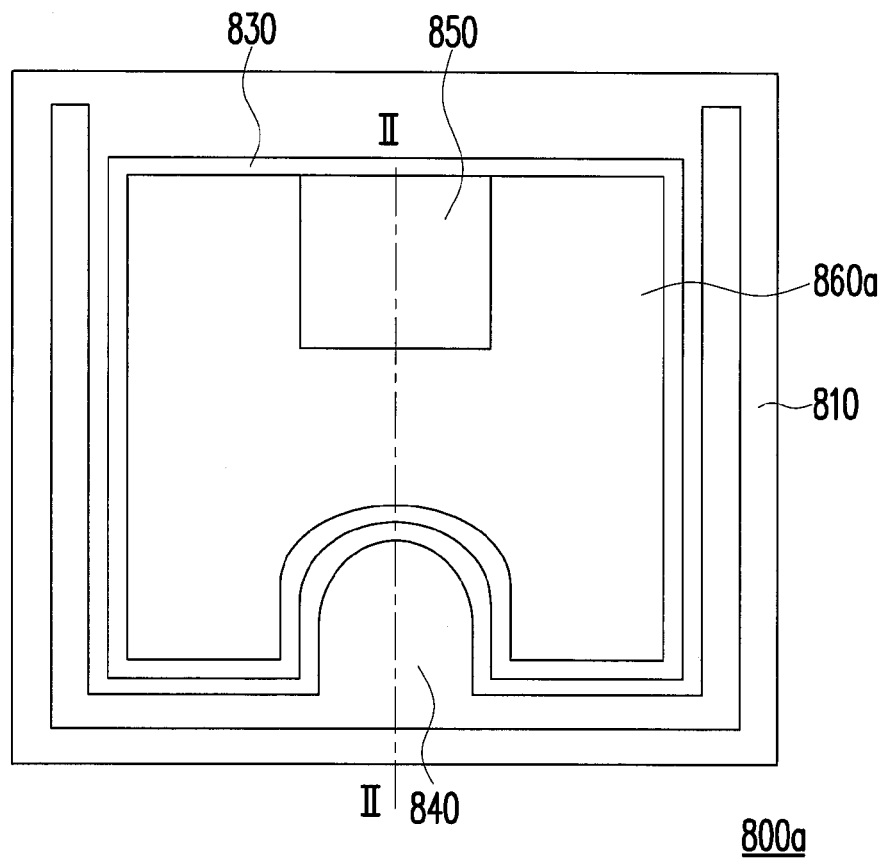
FIG. 3A is a schematic top view of a nitride semiconductor light emitting device according to another exemplary embodiment.
Figure 3B:
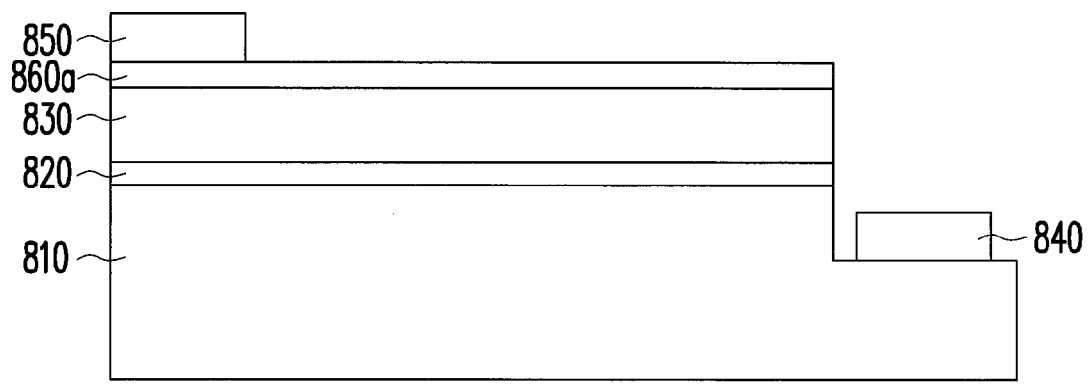
FIG. 3B is a schematic cross-sectional view of the nitride semiconductor light emitting device in FIG. 3A along line II-II.

FIG. 3A is a schematic top view of a nitride semiconductor light emitting device according to another exemplary embodiment, and FIG. 3B is a schematic cross-sectional view of the nitride semiconductor light emitting device in FIG. 3A along line II-II. Referring to FIGS. 3A and 3B, a nitride semiconductor light emitting device 800a in this embodiment is similar to the nitride semiconductor light emitting device 800, and the difference therebetween is as follows. In this embodiment, the nitride semiconductor light emitting device 800 further includes a second magnetic material layer 860a disposed between the second metal pad 850 and the p-type nitride semiconductor layer 830. The distribution area of the second magnetic material layer 860a parallel to the (0001) plane of the n-type nitride semiconductor layer 810 is greater than or equal to the area of the second metal pad 850 parallel to the (0001) plane.

In this embodiment, the material of the second magnetic material layer 860a is Co doped ZnO. However, in other embodiments, the material of the second magnetic material layer 860a may include Mn doped ZnO or a combination of Co doped ZnO and Mn doped ZnO. Moreover, in this embodiment, the doping concentration of Co in ZnO ranges from 2.5% to 9% by mole ratio. In addition, in this embodiment, the thickness of the second magnetic material layer 860a in the direction perpendicular to the (0001) plane ranges from 20 nanometer (nm) to 0.6 micrometer (μm).

In this embodiment, since holes from the second metal pad 850 flow to the light emitting semiconductor layer 820 through the magnetic material layer 860a and the p-type nitride semiconductor layer 830, the light efficiency of the nitride semiconductor light emitting device 800a is increased.

Figure 4A:
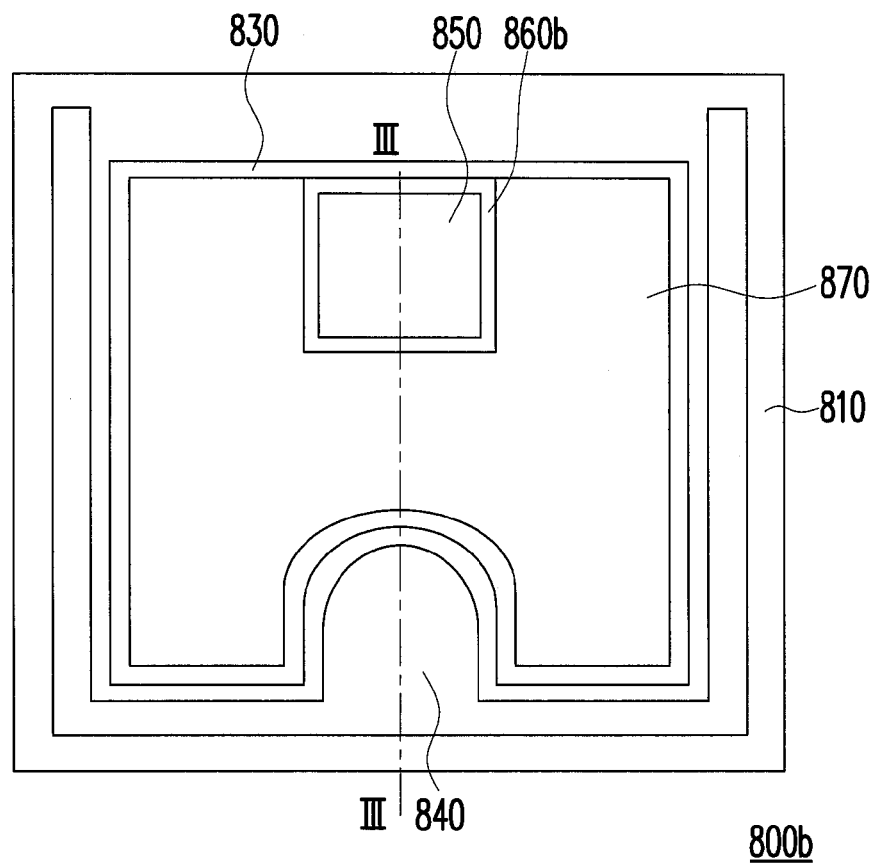
FIG. 4A is a schematic top view of a nitride semiconductor light emitting device according to another exemplary embodiment.
Figure 4B:
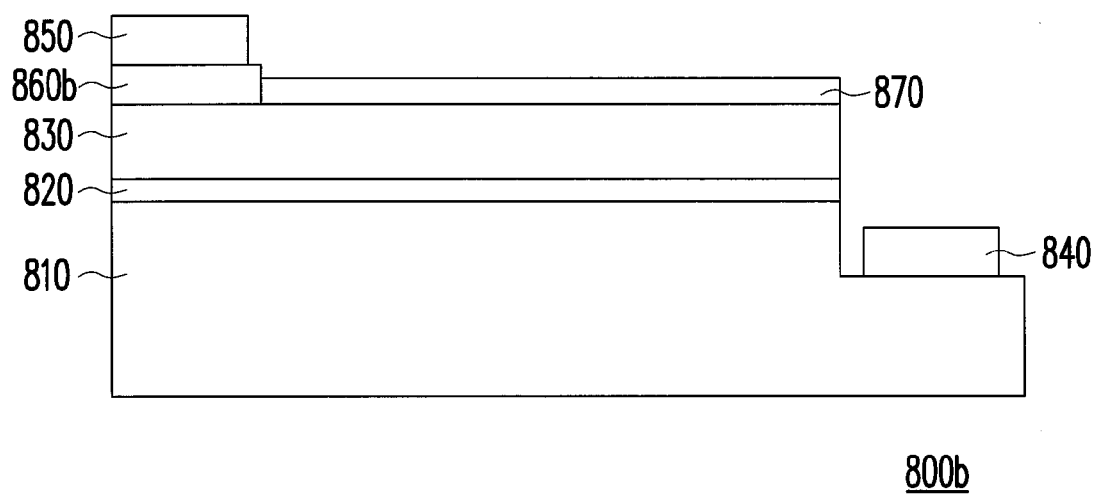
FIG. 4B is a schematic cross-sectional view of the nitride semiconductor light emitting device in FIG. 4A along line III-III.

FIG. 4A is a schematic top view of a nitride semiconductor light emitting device according to another exemplary embodiment, and FIG. 4B is a schematic cross-sectional view of the nitride semiconductor light emitting device in FIG. 4A along line III-III. Referring to FIGS. 4A and 4B, a nitride semiconductor light emitting device 800b in this embodiment is similar to the nitride semiconductor light emitting device 800a in FIGS. 3A and 3B, and the difference therebetween is as follows. In this embodiment, a second magnetic material layer 860b covers a part of the p-type nitride semiconductor layer 830, and the transparent conductive layer 870 covers another part of the p-type nitride semiconductor layer 830. Moreover, the transparent conductive layer 870 is physically and electrically connected with the second magnetic material layer. Besides, the distribution area of the second magnetic material layer 860b parallel to the (0001) plane of the n-type nitride semiconductor layer 810 is greater than or equal to the area of the second metal pad 850 parallel to the (0001) plane. The material and thickness of the second magnetic material layer 860b are the same as those of the second magnetic material layer 860a in FIGS. 3A and 3B, and are not repeated herein.

Figure 5:
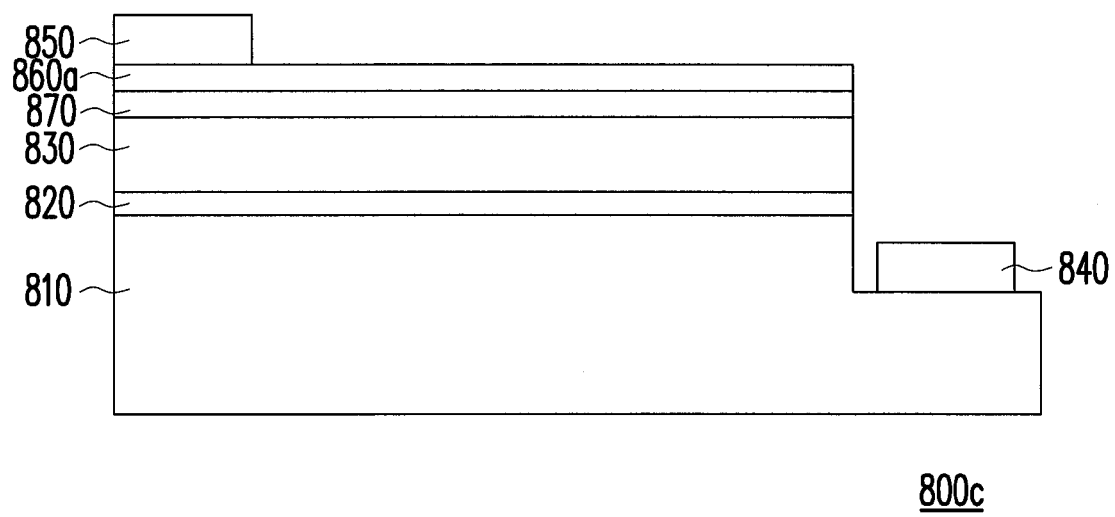
FIG. 5 is a schematic cross-sectional view of the nitride semiconductor light emitting device according to another exemplary embodiment.

FIG. 5 is a schematic cross-sectional view of the nitride semiconductor light emitting device according to another exemplary embodiment. Referring to FIG. 5, a nitride semiconductor light emitting device 800c in this embodiment is similar to the nitride semiconductor light emitting device 800a in FIG. 3B and the nitride semiconductor light emitting device 800b in FIG. 4B, and the difference therebetween is as follows. In the nitride semiconductor light emitting device 800c, the transparent conductive layer 870 is disposed between the second magnetic material layer 860a and the p-type nitride semiconductor layer 830.

Figure 6A:
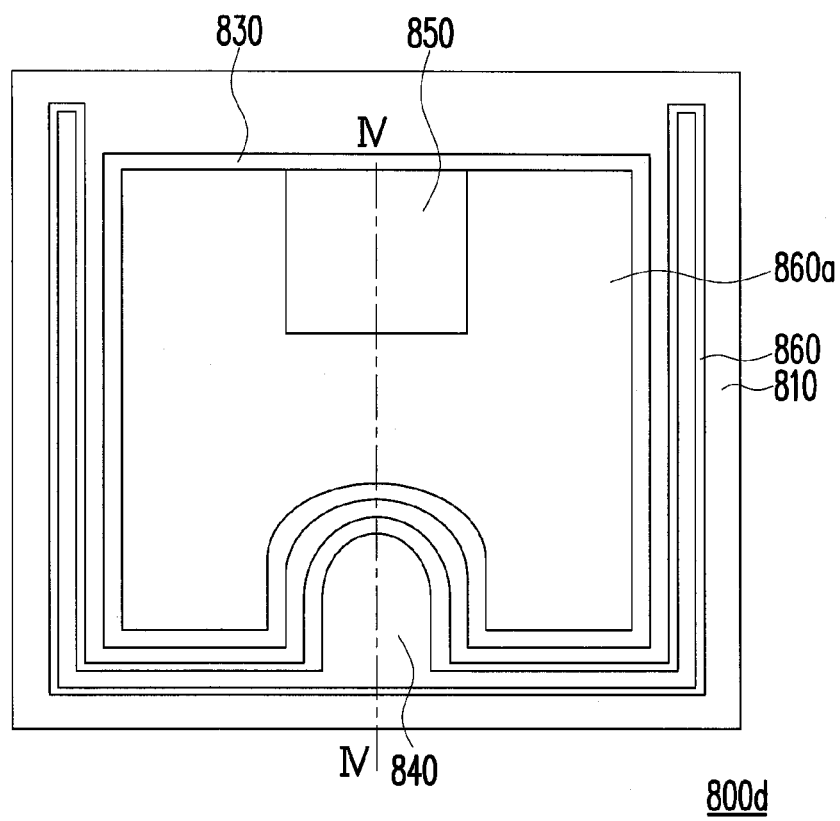
FIG. 6A is a schematic top view of a nitride semiconductor light emitting device according to another exemplary embodiment.
Figure 6B:
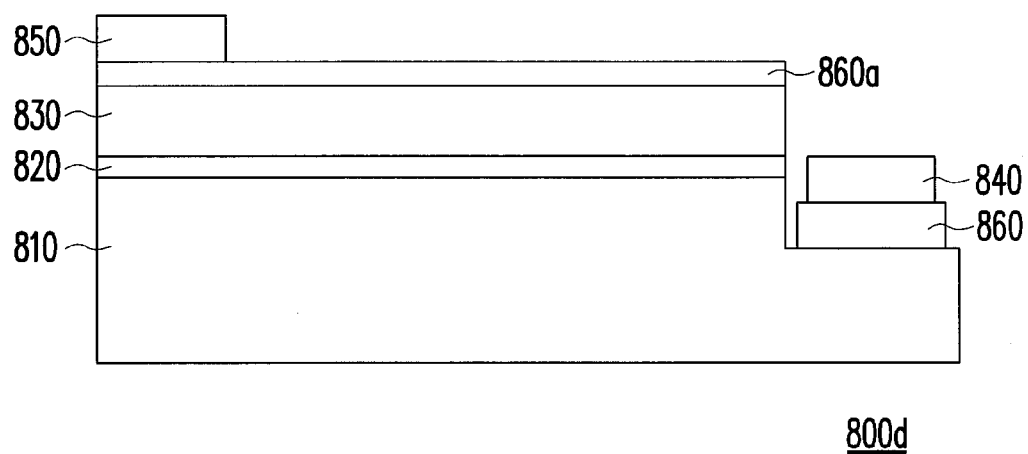
FIG. 6B is a schematic cross-sectional view of the nitride semiconductor light emitting device in FIG. 6A along line IV-IV.

FIG. 6A is a schematic top view of a nitride semiconductor light emitting device according to another exemplary embodiment, and FIG. 6B is a schematic cross-sectional view of the nitride semiconductor light emitting device in FIG. 6A along line IV-IV. Referring to FIGS. 6A and 6B, the nitride semiconductor light emitting device 800d in this embodiment is similar to the nitride semiconductor light emitting device 800 in FIG. 2B and the nitride semiconductor light emitting device 800a in FIG. 3B, and the difference therebetween is as follows. In this embodiment, the nitride semiconductor light emitting device 800d includes both the first magnetic material layer 860 and the second magnetic material layer 860a. The first magnetic material layer 860 is disposed between the first metal pad 840 and the n-type nitride semiconductor layer 810, and the second magnetic material layer 860a is disposed between the second metal pad 850 and the p-type nitride semiconductor layer 830.

Figure 7A:
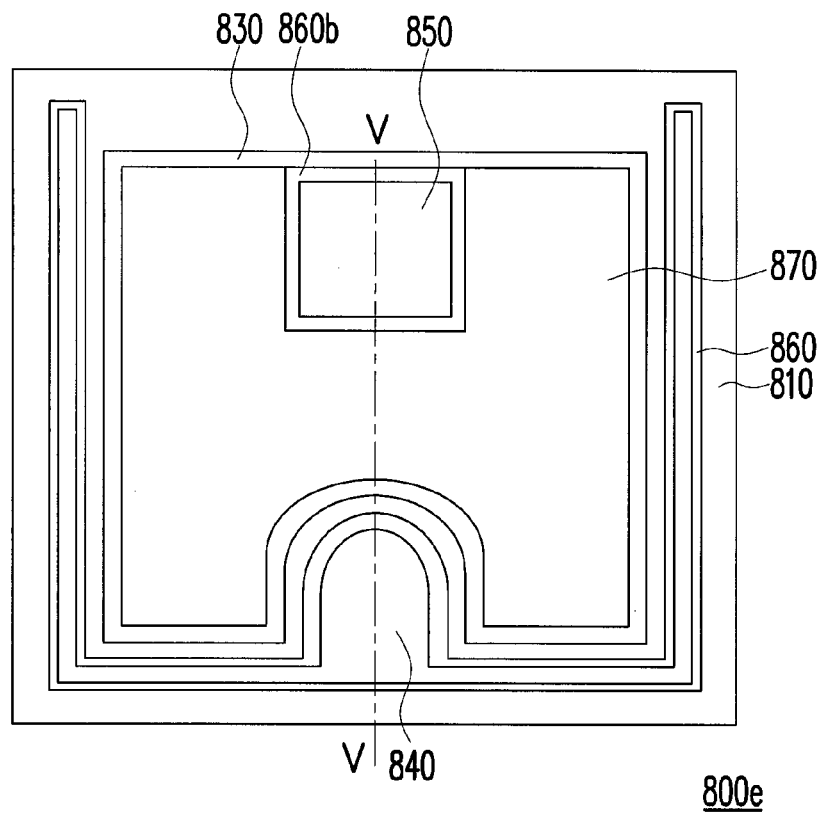
FIG. 7A is a schematic top view of a nitride semiconductor light emitting device according to another exemplary embodiment.
Figure 7B:
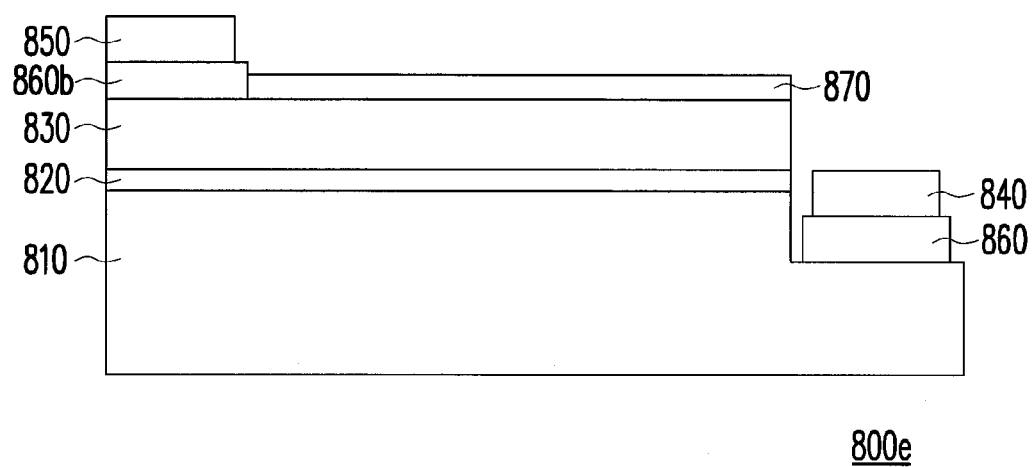
FIG. 7B is a schematic cross-sectional view of the nitride semiconductor light emitting device in FIG. 7A along line V-V.

FIG. 7A is a schematic top view of a nitride semiconductor light emitting device according to another exemplary embodiment, and FIG. 7B is a schematic cross-sectional view of the nitride semiconductor light emitting device in FIG. 7A along line V-V. Referring to FIGS. 7A and 7B, the nitride semiconductor light emitting device 800e in this embodiment is similar to the nitride semiconductor light emitting device 800 in FIG. 2B and the nitride semiconductor light emitting device 800b in FIG. 4B, and the difference therebetween is as follows. In this embodiment, the nitride semiconductor light emitting device 800e includes both the first magnetic material layer 860 and the second magnetic material layer 860b. The first magnetic material layer 860 is disposed between the first metal pad 840 and the n-type nitride semiconductor layer 810, and the second magnetic material layer 860b is disposed between the second metal pad 850 and the p-type nitride semiconductor layer 830.

Figure 8:
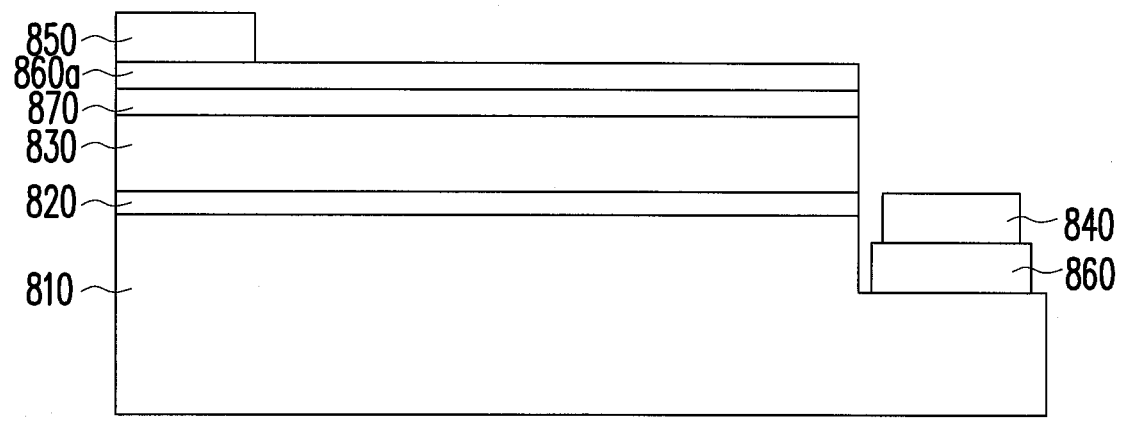
FIG. 8 is a schematic cross-sectional view of the nitride semiconductor light emitting device according to another exemplary embodiment.

FIG. 8 is a schematic cross-sectional view of the nitride semiconductor light emitting device according to another exemplary embodiment. Referring to FIG. 8, the nitride semiconductor light emitting device 800f in this embodiment is similar to the nitride semiconductor light emitting device 800 in FIG. 2B and the nitride semiconductor light emitting device 800c in FIG. 5, and the difference therebetween is as follows. In this embodiment, the nitride semiconductor light emitting device 800f includes both the first magnetic material layer 860 and the second magnetic material layer 860a. The first magnetic material layer 860 is disposed between the first metal pad 840 and the n-type nitride semiconductor layer 810, and the second magnetic material layer 860a is disposed between the second metal pad 850 and the transparent conductive layer 870.

Figure 9:
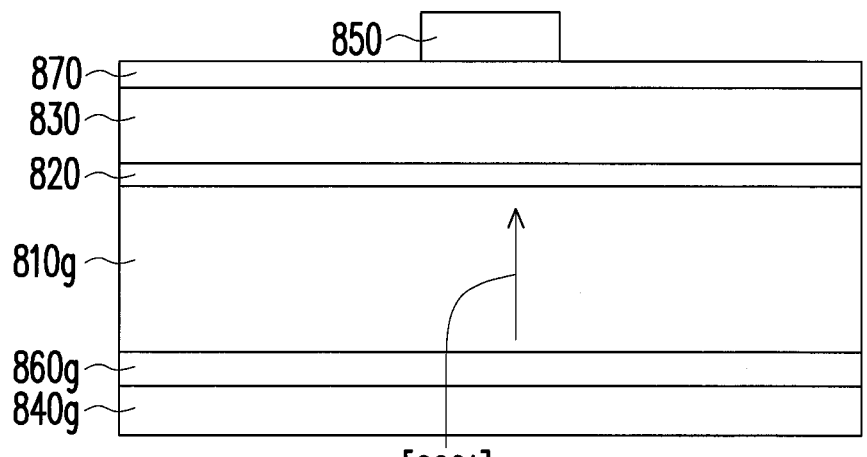
FIG. 9 is a schematic cross-sectional view of the nitride semiconductor light emitting device according to another exemplary embodiment.

FIG. 9 is a schematic cross-sectional view of the nitride semiconductor light emitting device according to another exemplary embodiment. Referring to FIG. 9, the nitride semiconductor light emitting device 800g in this embodiment is similar to the nitride semiconductor light emitting device 800 in FIG. 2B, and the difference therebetween is as follows. In this embodiment, the nitride semiconductor light emitting device 800g is a vertical type LED. That is to say, an n-type nitride semiconductor layer 810g is disposed between the light emitting semiconductor layer 820 and the first metal pad 840g, and the p-type nitride semiconductor layer 830 is disposed between the light emitting semiconductor layer 820 and the second metal pad 850. In this embodiment, the transparent conductive layer 870 is disposed between the second metal pad 850 and the p-type nitride semiconductor layer 830. The material of the n-type nitride semiconductor layer 810g is the same as that of the n-type nitride semiconductor layer 810, and the material of the first metal pad 840g is the same as that of the first metal pad 840.

In this embodiment, the n-type nitride semiconductor layer 810g, the light emitting semiconductor layer 820, and the p-type nitride semiconductor layer 830 are grown along the [0001] direction as that in FIG. 2B. In this embodiment, the distribution area of the first magnetic material layer 860g parallel to the (0001) plane of the n-type nitride semiconductor layer 810g is equal to an area of the first metal pad 840g parallel to the (0001) plane. However, in other embodiments, the distribution area of the first magnetic material layer 860g parallel to the (0001) plane of the n-type nitride semiconductor layer 810g may be greater than an area of the first metal pad 840g parallel to the (0001) plane.

Figure 10:
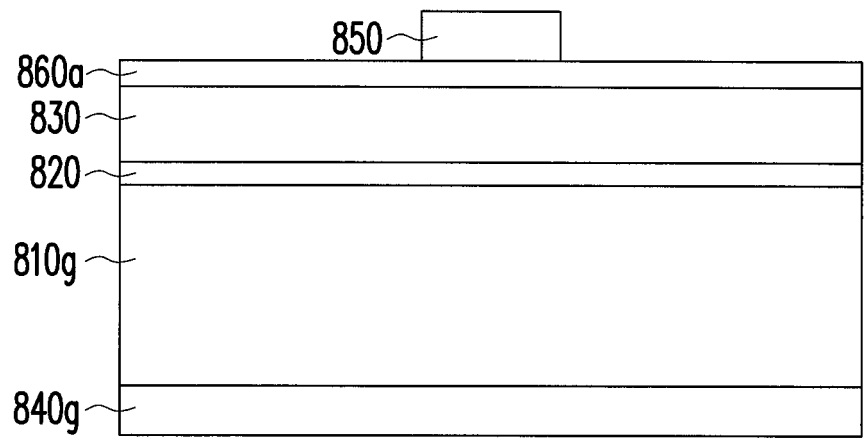
FIG. 10 is a schematic cross-sectional view of the nitride semiconductor light emitting device according to another exemplary embodiment.

FIG. 10 is a schematic cross-sectional view of the nitride semiconductor light emitting device according to another exemplary embodiment. Referring to FIG. 10, the nitride semiconductor light emitting device 800h in this embodiment is similar to the nitride semiconductor light emitting device 800a in FIG. 3B and the nitride semiconductor light emitting device 800g in FIG. 9, and the difference therebetween is as follows. In this embodiment, the nitride semiconductor light emitting device 800h is a vertical LED, and the second magnetic material layer 860a is disposed between the second metal pad 850 and the p-type nitride semiconductor layer 830.

Figure 11:
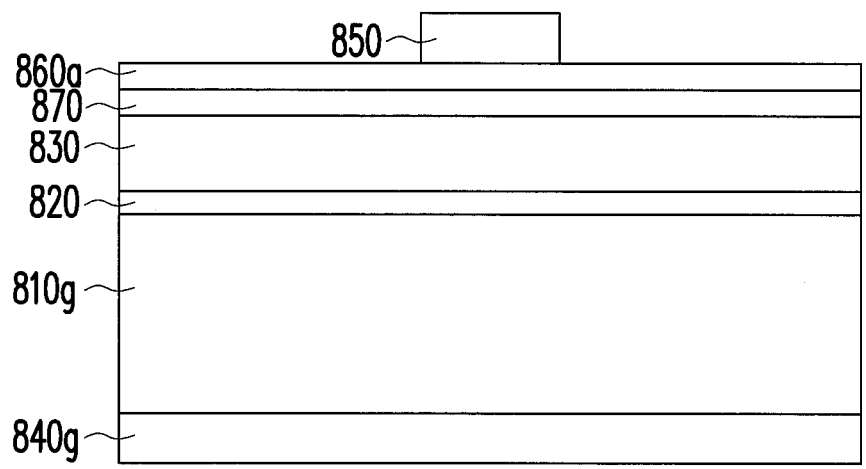
FIG. 11 is a schematic cross-sectional view of the nitride semiconductor light emitting device according to another exemplary embodiment.

FIG. 11 is a schematic cross-sectional view of the nitride semiconductor light emitting device according to another exemplary embodiment. Referring to FIG. 11, the nitride semiconductor light emitting device 800i in this embodiment is similar to the nitride semiconductor light emitting device 800c in FIG. 5 and the nitride semiconductor light emitting device 800h in FIG. 10, and the difference therebetween is as follows. In the nitride semiconductor light emitting device 800i of this embodiment, the transparent conductive layer 870 is disposed between the second magnetic material layer 860a and the p-type nitride semiconductor layer 830.

Figure 12:
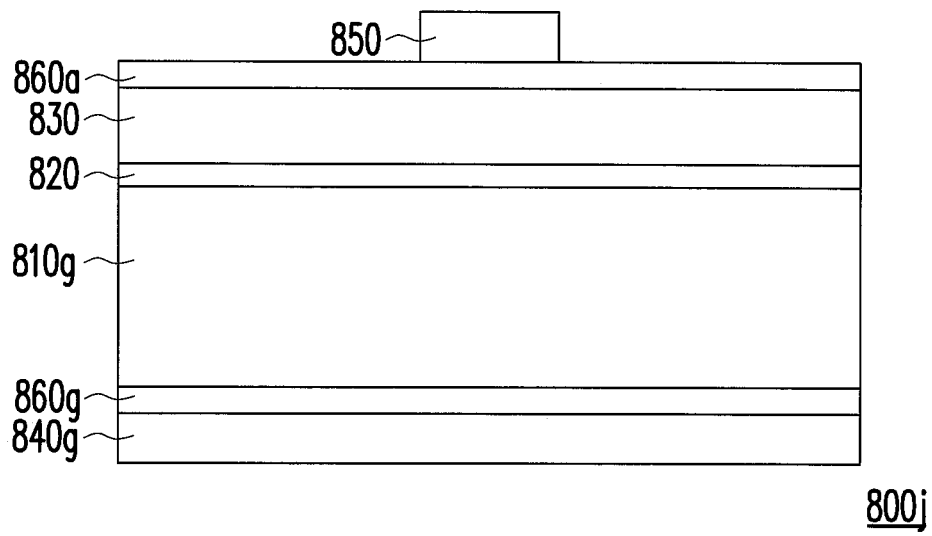
FIG. 12 is a schematic cross-sectional view of the nitride semiconductor light emitting device according to another exemplary embodiment.

FIG. 12 is a schematic cross-sectional view of the nitride semiconductor light emitting device according to another exemplary embodiment. Referring to FIG. 12, the nitride semiconductor light emitting device 800j in this embodiment is similar to the nitride semiconductor light emitting device 800g in FIG. 9 and the nitride semiconductor light emitting device 800h in FIG. 10, and the difference therebetween is as follows. In this embodiment, the nitride semiconductor light emitting device 800j includes both the first magnetic material layer 860g and the second magnetic material layer 860a. The first magnetic material layer 860g is disposed between the n-type nitride semiconductor layer 810g and the first metal pad 840g, and the second magnetic material layer 860a is disposed between the p-type nitride semiconductor layer 830 and the second metal pad 850.

Figure 13:
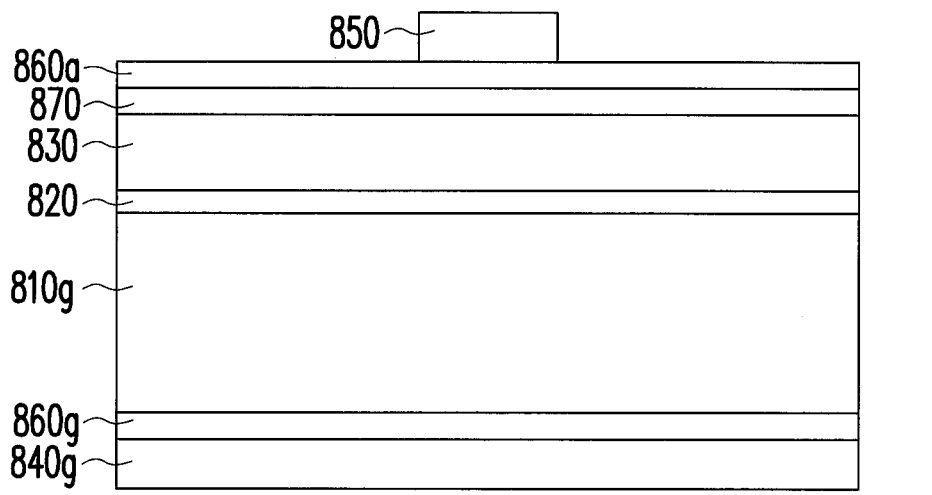
FIG. 13 is a schematic cross-sectional view of the nitride semiconductor light emitting device according to another exemplary embodiment.

FIG. 13 is a schematic cross-sectional view of the nitride semiconductor light emitting device according to another exemplary embodiment. Referring to FIG. 13, the nitride semiconductor light emitting device 800k in this embodiment is similar to the nitride semiconductor light emitting device 800g in FIG. 9 and the nitride semiconductor light emitting device 800i in FIG. 11, and the difference therebetween is as follows. In this embodiment, the nitride semiconductor light emitting device 800k includes both the first magnetic material layer 860g and the second magnetic material layer 860a. The first magnetic material layer 860g is disposed between the n-type nitride semiconductor layer 810g and the first metal pad 840g, and the second magnetic material layer 860a is disposed between the transparent conductive layer 870 and the second metal pad 850.

Figure 14:
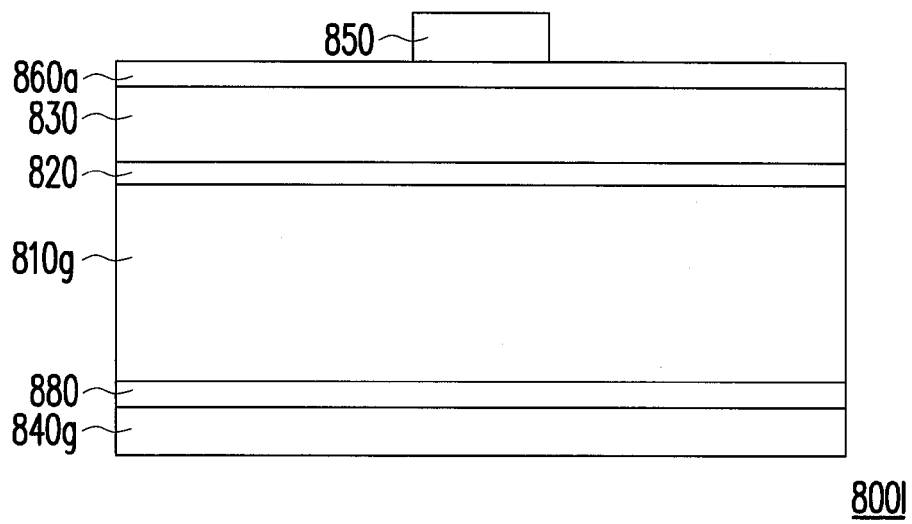
FIG. 14 is a schematic cross-sectional view of the nitride semiconductor light emitting device according to another exemplary embodiment.

FIG. 14 is a schematic cross-sectional view of the nitride semiconductor light emitting device according to another exemplary embodiment. Referring to FIG. 14, the nitride semiconductor light emitting device 800l in this embodiment is similar to the nitride semiconductor light emitting device 800h in FIG. 10, and the difference therebetween is as follows. In this embodiment, the nitride semiconductor light emitting device 800l further includes a reflection layer 880 disposed between the n-type nitride semiconductor layer 810g and the first metal pad 840g for reflecting light from the light emitting semiconductor layer 820. In this embodiment, the reflection layer 880 is, for example a reflective metal layer and is electrically conductive.

Figure 15:
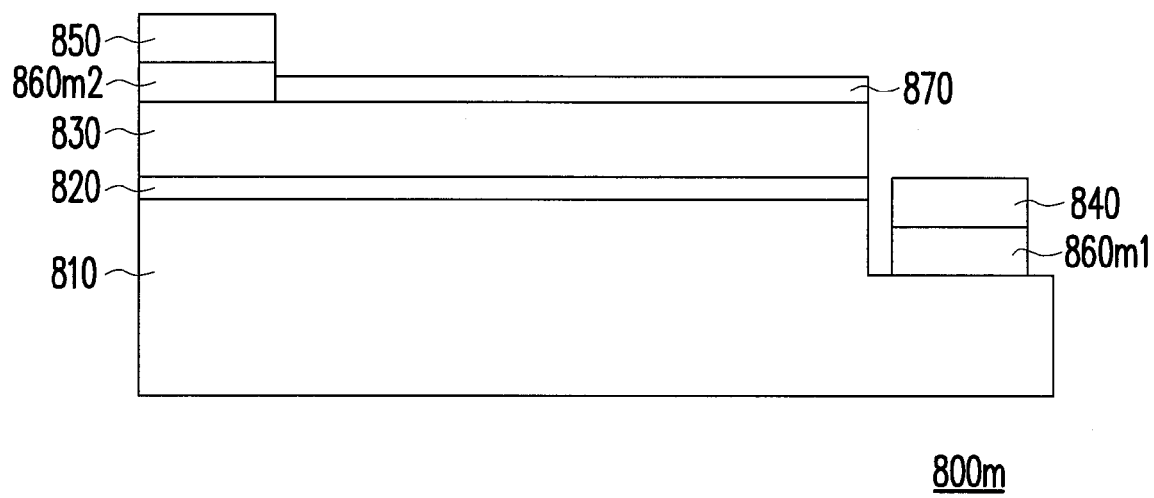
FIG. 15 is a schematic cross-sectional view of the nitride semiconductor light emitting device according to another exemplary embodiment.

FIG. 15 is a schematic cross-sectional view of the nitride semiconductor light emitting device according to another exemplary embodiment. Referring to FIG. 15, the nitride semiconductor light emitting device 800m in this embodiment is similar to the nitride semiconductor light emitting device 800e in FIG. 7B, and the difference therebetween is as follows. In FIG. 7B, the distribution area of the first magnetic material layer 860 parallel to the (0001) plane of the n-type nitride semiconductor layer 810 is greater than the area of the first metal pad 840 parallel to the (0001) plane, and the distribution area of the second magnetic material layer 860b parallel to the (0001) plane of the n-type nitride semiconductor layer 810 is greater than the area of the second metal pad 850 parallel to the (0001) plane. However, in the nitride semiconductor light emitting device 800m, the distribution area of the first magnetic material layer 860m1 parallel to the (0001) plane of the n-type nitride semiconductor layer 810 is equal to the area of the first metal pad 840 parallel to the (0001) plane, and the distribution area of the second magnetic material layer 860m2 parallel to the (0001) plane of the n-type nitride semiconductor layer 810 is equal to the area of the second metal pad 850 parallel to the (0001) plane.

Figure 16:
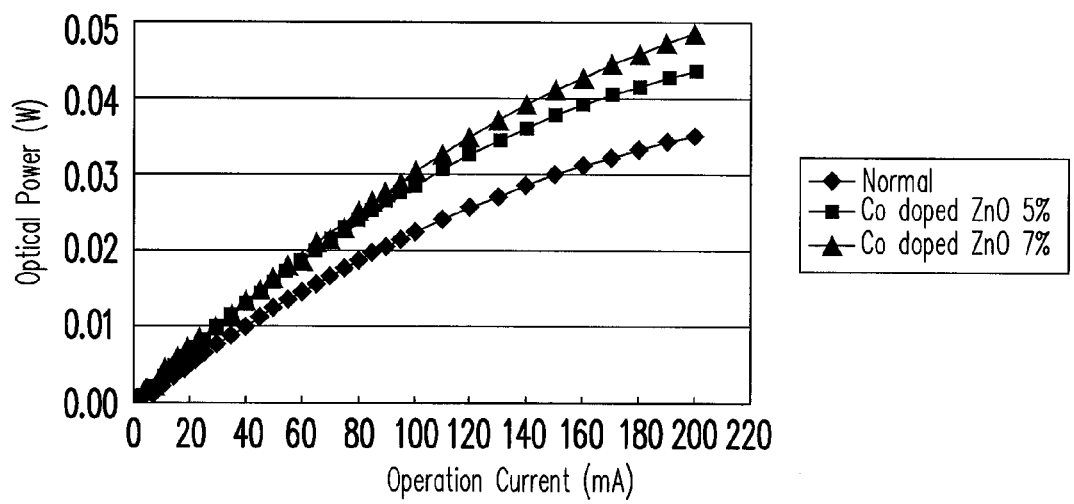
FIG. 16 is a curve diagram of the optical power versus the operation current of a nitride semiconductor light emitting device without any magnetic material layer and nitride semiconductor light emitting devices with first magnetic material layers.

FIG. 16 is a curve diagram of the optical power versus the operation current of a nitride semiconductor light emitting device without any magnetic material layer and nitride semiconductor light emitting devices with first magnetic material layers. In FIG. 16, the curve denoted by "Normal" corresponds to the data of the nitride semiconductor light emitting device without any magnetic material layer. The curve denoted by "Co doped ZnO 5%" corresponds to the data of the nitride semiconductor light emitting device with a first magnetic material layer, wherein the material of the first magnetic material layer is Co doped ZnO, and the doping concentration of Co in ZnO is 5% by mole ratio. The curve denoted by "Co doped ZnO 7%" corresponds to the data of the nitride semiconductor light emitting device with a first magnetic material layer, wherein the material of the first magnetic material layer is Co doped ZnO, and the doping concentration of Co in ZnO is 7%. by mole ratio. FIG. 16 shows that the nitride semiconductor light emitting device with a first magnetic material layer has a higher optical power than that of the nitride semiconductor light emitting device without any magnetic material layer, and shows that the higher the doping concentration, the higher optical power of the nitride semiconductor light emitting device.

Figures 17A, 17B, 17C:
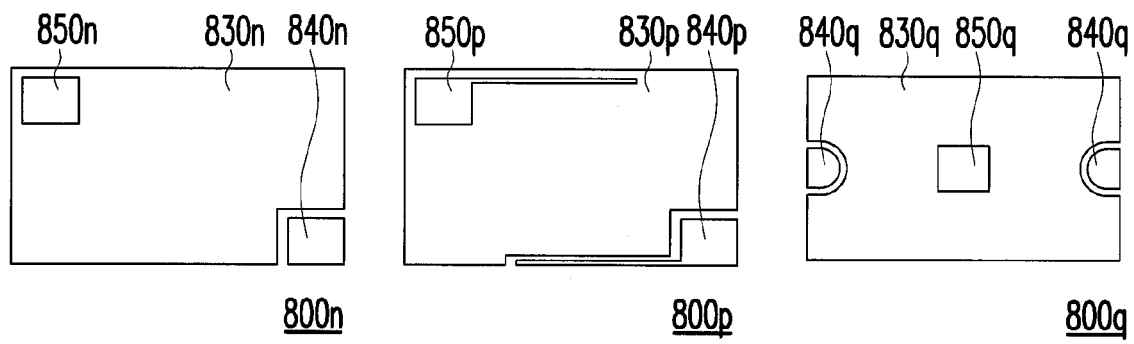
FIGS. 17A through 17C show other variations of the shapes of the first metal pad, the second metal pad, and the p-type nitride semiconductor layer in FIG. 2A.

FIGS. 17A through 17C show other variations of the shapes of the first metal pad, the second metal pad, and the p-type nitride semiconductor layer in FIG. 2A. Referring to FIG. 2A and FIGS. 17A through 17C, the shapes of the first metal pad 840, the second metal pad 850, and the p-type nitride semiconductor layer 830 are not limited to those shown in FIG. 2A. In other embodiments, the first metal pads 840$n$, 840$p$, 840$q$, the second metal pads 850$n$, 850$p$, 850$q$, and the p-type nitride semiconductor layers 830$n$, 830$p$, 830$q$ in the nitride semiconductor light emitting device 800$n$, 800$p$, 800$q$ respectively shown in FIGS. 17A, 17B, and 17C may have other different shapes. In the above embodiments of FIGS. 2A through 8 and 15, the shapes of the first metal pad 840, the second metal pad 850, and the p-type nitride semiconductor layer 830 may be changed to the shapes of the first metal pad 840$n$, 840$p$, or 840$q$, the second metal pad 850$n$, 850$p$, or 850$q$, and the p-type nitride semiconductor layer 830$n$, 830$p$, or 830$q$ or other appropriate shapes, and the shapes of the first magnetic material layer and the second magnetic material layer are also changed with the above changed shapes.

Figure 18:
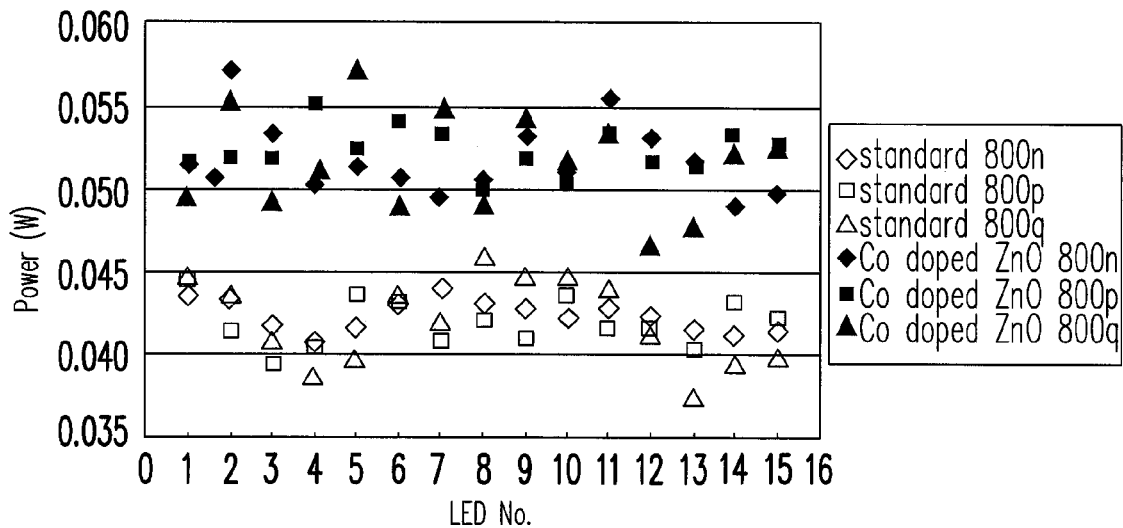
FIG. 18 shows the optical powers of nitride semiconductor light emitting devices without any magnetic material layer and with first magnetic material layers.

FIG. 18 shows the optical powers of nitride semiconductor light emitting devices without any magnetic material layer and with first magnetic material layers. Referring to FIGS. 17A through 17C and FIG. 18, the data denoted by "standard 800$n$", "standard 800$p$", and "standard 800$q$" respectively correspond to the data of nitride semiconductor light emitting devices without any magnetic material layer and with the shapes respectively shown in FIGS. 17A, 17B, and 17C. Moreover, the data denoted by "Co doped ZnO 800$n$", "Co doped ZnO 800$p$", and "Co doped ZnO 800$q$" respectively correspond to the data of nitride semiconductor light emitting devices with the shapes respectively shown in FIGS. 17A, 17B, and 17C and with first magnetic material layers of which the material is Co doped ZnO. "LED No." represents the same kind of nitride semiconductor light emitting device with different serial numbers, and "Power (W)" represents the optical power of the nitride semiconductor light emitting device. FIG. 18 shows that the nitride semiconductor light emitting device with the first magnetic material layer has a optical power higher than that of the nitride semiconductor light emitting device without any magnetic material layer.

Figure 19:
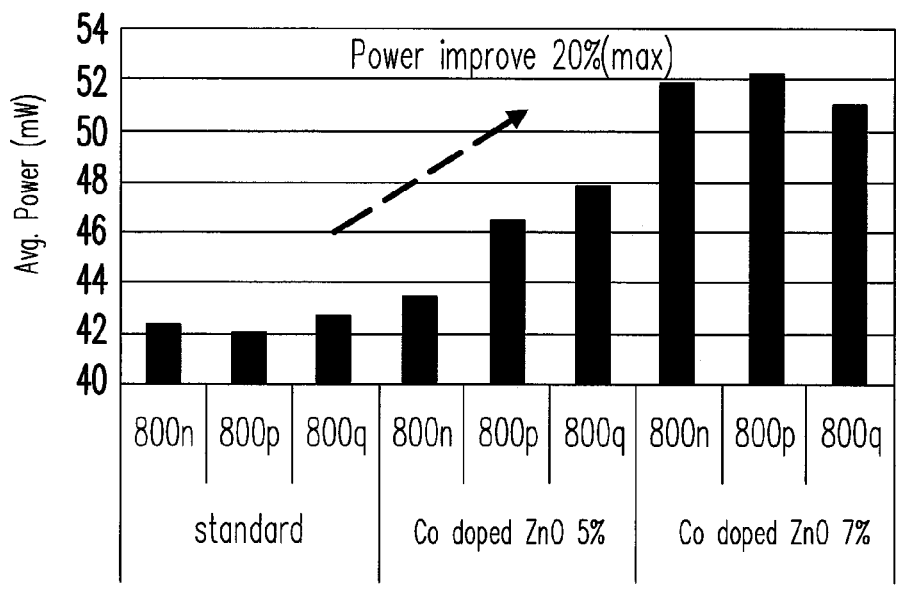
FIG. 19 shows the average optical powers of the LED No. 1-15 which also consider the doping concentration of Co in ZnO.

FIG. 19 shows the average optical powers of the LED No. 1-15 which also consider the doping concentration of Co in ZnO. In FIG. 19, the data denoted by "Co doped ZnO 5%" and "Co doped ZnO 7%" respectively correspond to the nitride semiconductor light emitting devices with the first magnetic material layers wherein the doping concentrations of Co in ZnO are respectively 5% and 7%. FIG. 19 shows that the maximum increase of the nitride semiconductor light emitting device with the first magnetic material layer relative to the nitride semiconductor light emitting device without any magnetic material layer is even up to about 20%, for example.

Figure 20:
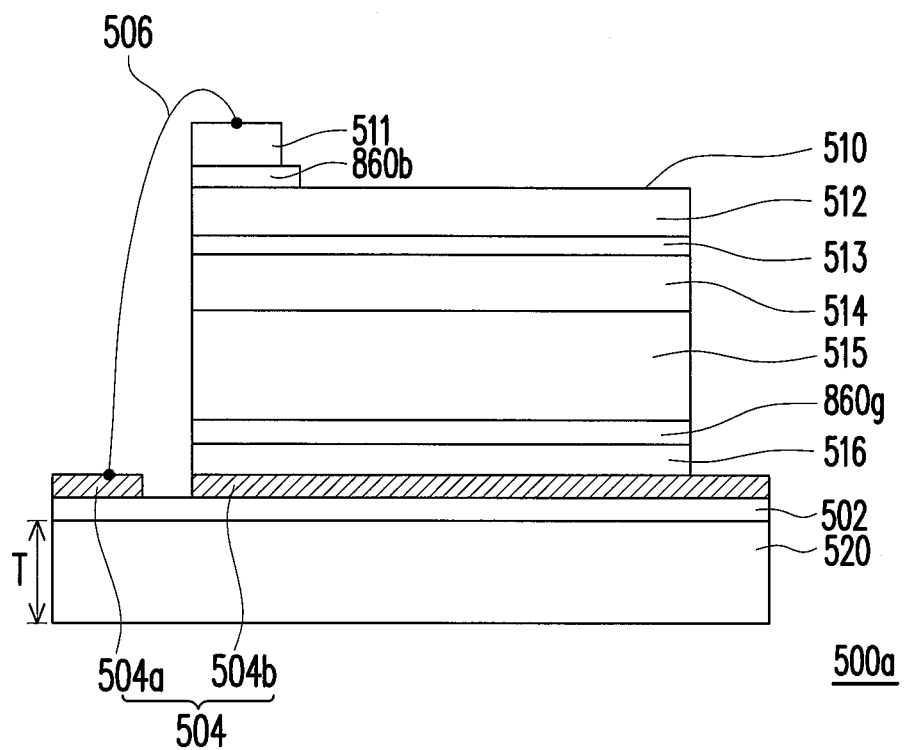
FIG. 20 is a cross-section view of a light emitting device according to an exemplary embodiment.

FIG. 20 is a cross-section view of a light emitting device according to an exemplary embodiment. Referring to FIG. 20, as for a standard LED having a vertical type structure, the light emitting device 500$a$ of the present embodiment is a vertical type LED, which includes a light emitting chip 510 and a magnetic material (e.g. a magnetic submount 520). The magnetic submount 520 is disposed beside the light emitting chip 510. In this embodiment, the light emitting chip 510 is disposed on the magnetic submount 520 through an epoxy, a metal bonding, a wafer bonding, epitaxy embeding, or a coating process.

The light emitting chip 510 includes, from top to bottom, a first electrode 511, a first doped layer 512, an active layer 513 (e.g. a light emitting semiconductor layer), a second doped layer 514, a substrate 515, and a second electrode 516, in which the first doped layer 512, the active layer 513, and the second doped layer 514 form a light emitting stacking layer (i.e. a semiconductor stack structure), which is disposed on the substrate 515. The first electrode 511 is disposed on the first doped layer 512 and electrically coupled to the first doped layer 512, and the second electrode 516 is disposed under the substrate 515 and electrically coupled to the second doped layer 514, so as to form a vertical type LED structure. The active layer 513 is disposed between first electrode 511 and the second electrode 516, and capable of generating light when a current flows through it.

In this embodiment, the light emitting device 500$a$ further includes the first magnetic material layer 860$g$ as the first magnetic material layer 860$g$ shown in FIG. 9 and the second magnetic material layer 860$b$ as the second magnetic material layer 860$b$ shown in FIG. 4B, wherein the first magnetic material layer 860$g$ is disposed between the second electrode 516 and the substrate 515, and the second magnetic material layer 860$b$ is disposed between the first electrode 511 and the first doped layer 512. The first magnetic material layer 860$g$ and the second magnetic material layer 860$b$ increase the light efficiency of the light emitting device 500$a$ due to the reasons set forth in the above embodiments. In other embodiments, the light emitting device 500$a$ may include the first magnetic material layer 860 but not the second magnetic material layer 860$b$. Alternatively, the light emitting device 500$a$ may include the second magnetic material layer 860$b$ but not the first magnetic material layer 860.

In addition, the magnetic field induced by the magnetic submount 520 is exerted on the light emitting chip 510, such that the main distribution of current density in the light emitting chip 510 is moved from an area between the first electrode 511 and the second electrode 516 to an area under the light-out plane, so as to enhance the current homogeneity and increase an overall brightness of the light emitting device 500$a$.

In this embodiment, the magnetic submount 520 is not disposed on a conducting path of a current, wherein the conducting path passes through the first doped layer 512, the active layer 513, and the second doped layer 514. The current causes the light emitting chip 510 to emit light, and the current does not pass through the magnetic submount 520. Specifically, the light emitting device 500$a$ may include an insulation layer 502 and a circuit layer 504. The insulation layer 502 is disposed between the light emitting chip 510 and the magnetic submount 520 for insulating the light emitting chip 510 and the magnetic submount 520. The circuit layer 504 is disposed on the insulation layer 502, wherein the insulation layer 502 insulates the circuit layer 504 and the magnetic submount 520. The circuit layer 504 includes a first circuit 504$a$ and a second circuit 504$b$. The first circuit 504$a$ is electrically connected to the first doped layer 512, and the second circuit 504$b$ is electrically connected to the second doped layer 514. In this embodiment, the circuit layer 504 having two circuit is taken as an example, but the disclosure is not limited thereto. In other embodiments, the number of the circuits of the circuit layer 504 may be adjusted according to the size of the light emitting device 500$a$ or other requirements.

In this embodiment, the first electrode 511 and the second electrode 516 are respectively disposed on opposite sides of the semiconductor stack structure, and the light emitting device 500$a$ further includes a bonding wire 506 connecting the first electrode 511 and the first circuit 504$a$. The material of the bonding wire 506 is, for example, gold (Au), gold-tin alloy (AuSn), lead-tin alloy (PbSn), or other suitable metals. Moreover, the first doped layer 512 and second doped layer 514 are respectively an n-type semiconductor layer and a p-type semiconductor layer, or are respectively a p-type semiconductor layer and an n-type semiconductor layer. When the first doped layer 512 and second doped layer 514 are respectively an n-type semiconductor layer and a p-type semiconductor layer, the path of the current causing the active layer 513 to emit light passes through the second circuit 504b, the second electrode 516, the substrate 515, the second doped layer 514, the active layer 513, the first doped layer 512, the first electrode 511, the bonding wire 506, and the first circuit 504a and does not pass through the magnetic submount 520 due to the insulation layer 502.

In this embodiment, the thickness T of the magnetic submount 520 is greater than 1 millimeter, and the layers and elements of the light emitting device 500a are not drawn to scale in FIG. 20. Specifically, the thickness T of the magnetic submount 520 may larger than the thickness of the light emitting chip 510. Moreover, in this embodiment, the magnetic submount 520 does not directly contact the semiconductor stack structure. For example, there is an insulation layer 502 disposed between the magnetic submount 520 and the semiconductor stack structure.

In this embodiment, the magnetic submount 520 has a size larger than the first electrode 511 and the second electrode 516. For example, the area of the magnetic submount 520 in a direction parallel to the active layer 513 is larger than the area of the first electrode 506 in the direction parallel to the active layer 513 and is larger than the area of the second electrode 516 in the direction parallel to the active layer 513.

In another embodiment, a block layer is disposed between the first electrode 511 and the first doped layer 512 for blocking a part of the electrical connection between first electrode 511 and the first doped layer 512. In another embodiment, an isolating layer is further disposed between the substrate 515 and the magnetic submount 520 as described in the previous embodiment. In another embodiment, a mirror layer is further disposed between the substrate 515 and the second electrode 516 for reflecting the light emitted from the active layer 513. In other embodiments, the mirror layer may also be disposed between second doped layer 514 and the substrate 515 or between the second electrode 516 and the magnetic submount 520 for reflecting light, but not limited to them. In another embodiment, a roughness pattern is fabricated on a top surface of the first doped layer 512 to increase the surface reflectivity of the first doped layer 512. Moreover, the roughness pattern may be fabricated on the top surface of the substrate 515 (or the bottom surface of the second doped layer 514), or fabricated on the top surface of the second electrode 516 (or the bottom surface of the substrate 515).

Figure 21:
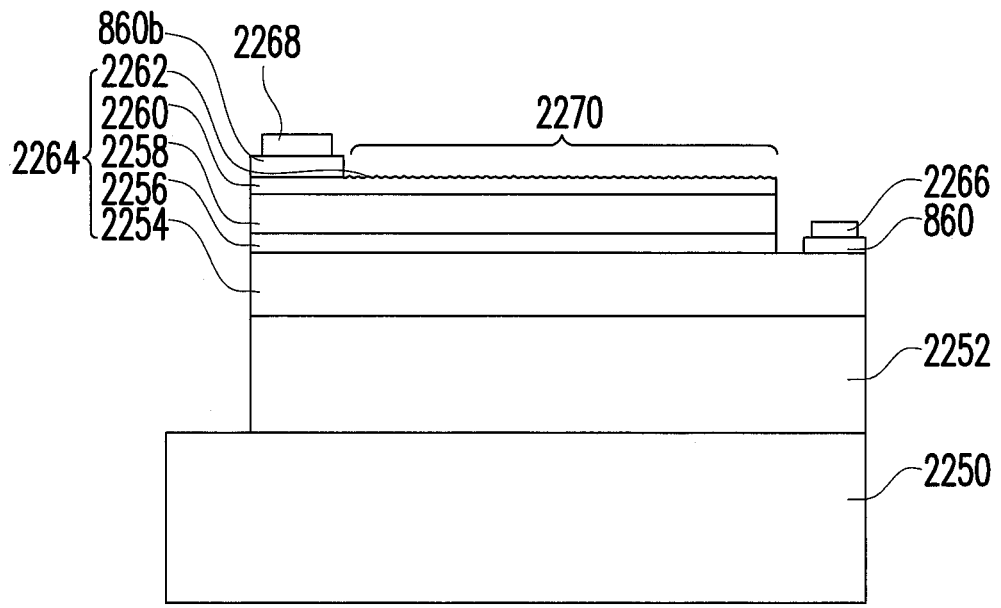
FIG. 21 is a cross-sectional view, schematically illustrating the structure of the light emitting device, according to another embodiment of the disclosure.

FIG. 21 is a cross-sectional view, schematically illustrating the structure of the light emitting device, according to another embodiment of the disclosure. In FIG. 21, a light-emitting structure can include the basic structure 2264, disposed on a substrate 2252. The basic structure 2264 may include, for example, a bottom doped stack layer 2254, an active layer 2256, an upper doped stack layer 2258. Here, the bottom doped stack layer 2254 and the upper doped stack layer 2258 are in different conductive types. However, depending on the operation voltage, the bottom doped stack layer 2254 or the upper doped stack layer 2258 can be p-type or n-type. In addition, due to for example the relative poor contact between the electrode and the doped semiconductor material, the transparent conductive layer (TCL) 2260 may also be included, for example. In addition, in order to have better performance of light output in the light emitting area 2270, a rough surface 2262 can be formed, which is for example formed on the TCL 2260 or on the upper doped stack layer 2258. Actually, the rough surface 2262 can be at any proper surface depending on the light output direction. The two electrodes 2266 and 2268, respectively disposed on the bottom doped stack layer 2254 and the upper doped stack layer 2258, are at the same side of the light-emitting structure, that is also called horizontal-type light emitting device. In this horizontal design, there is a horizontal component of driving current in the upper doped stack layer 2258 or even in the TCL 2260 if the TCL is included. Particularly, the basic structure 2264 is thin film design to reduce the thickness, and then the horizontal component of the driving current is relative large.

In the disclosure, a magnetic-source layer 2250 is additional added and is implemented on the substrate 2252 at the other side. In this embodiment, the substrate 2252 is, for example, an insulation substrate. The magnetic-source layer 2250 is used to produce a magnetic field so as to redistribute the current density of the horizontal component in the upper doped stack layer 2258, based on the mechanism of FIG. 2B. The magnetic-source layer 2250 can, for example, be an artificial ferromagnetic layer with the magnetization to provide a magnetic field substantially perpendicular to the light emitting area 2270, so as to redistribute the current density of the horizontal component. The locations of the electrodes 2266 and 2268 are set in accordance the magnetic field be produced. It can be understood that the magnetic-source layer 2250 is used to produce the intended magnetic field for shift the driving current, and any proper modified design can be implemented. The magnetic-source layer 2250 can also serves as another substrate. Even for example, the magnetic-source layer 2250 can be an external structure or unit without physically contact. In other words, magnetic-source layer 2250 can an external unit for applying the magnetic field or an integrated structure layer in the light emitting structure.

In this embodiment, the light-emitting structure further includes the first magnetic material layer 860 as the first magnetic material layer 860 shown in FIG. 2B and the second magnetic material layer 860b as the second magnetic material layer 860b shown in FIG. 4B, wherein the first magnetic material layer 860 is disposed between the electrode 2266 and the bottom doped stack layer 2254, and the second magnetic material layer 860b is disposed between the electrode 2268 and the upper doped stack layer 2258. The first magnetic material layer 860 and the second magnetic material layer 860b increase the light efficiency of the light-emitting structure due to the reasons set forth in the above embodiments. In other embodiments, the light-emitting structure may include the first magnetic material layer 860 but not the second magnetic material layer 860b. Alternatively, the light-emitting structure may include the second magnetic material layer 860b but not the first magnetic material layer 860.

Based on the same concept of the mechanism, a reflection layer can be formed between the substrate 2252 and the bottom doped stack layer 2254, or between the magnetic-source layer 2250 and the substrate 2252. For example, the reflection layer may be a metal layer or made by other manner to form the reflection property. In another embodiment, even further, the above reflection layer can be, for example, replaced by insulating layer, substrate with reduced thickness or reflection layer in reduced thickness.

In foregoing embodiments, the magnetic-source layer 2250 is implemented at the bottom. However, the magnetic-source layer 2250 can be implemented at the upper side. Since the surface level at the upper side of the light emitting structure is usually not planar, the magnetic-source layer can be implemented by, for example, packaging manner.

In other embodiments, the light-emitting structure may also include at least one of the above block layer and the above isolating layer.

To sum up, in the nitride semiconductor light emitting device according to the exemplary embodiments, since the current flows through the magnetic material layer, the light efficiency of the nitride semiconductor light emitting device is increased. Moreover, the magnetic material layer may reduce current crowding, so that the internal quantum efficiency and the lifetime of the nitride semiconductor light emitting device are increased.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A nitride semiconductor light emitting device comprising:
   an n-type nitride semiconductor layer;
   a p-type nitride semiconductor layer;
   a light emitting semiconductor layer disposed between the n-type nitride semiconductor layer and the p-type nitride semiconductor layer;
   a first metal pad electrically connected to the n-type nitride semiconductor layer;
   a second metal pad electrically connected to the p-type nitride semiconductor layer; and
   a first magnetic material layer disposed between the first metal pad and the n-type nitride semiconductor layer, wherein a distribution area of the first magnetic material layer parallel to a (0001) plane of the n-type nitride semiconductor layer is greater than or equal to an area of the first metal pad parallel to the (0001) plane.

2. The nitride semiconductor light emitting device according to claim 1, wherein a material of the first magnetic material layer comprises a magnetic element doped compound, the magnetic element comprises a transition metal, a rare earth element, or a combination thereof, and the compound comprises $CuAlO_2$, $CuGaO_2$, $AgInO_2$, $SrCu_2O_2$, $Cd_2SnO_4$, $In_2O_3$, $TiO_2$, $Cu_2O$, ZnO, $SnO_2$, CdO, ZnO, MnSe, ZnSe, CdSe, MgSe, ZnTe, MnTe, MgTe, CdTe, CdS, ZnS, HgS, HgSe, HdTe, NiO, MnO, GaN, InN, AlN, InAs, GaAs, AlAs, GaP, InP, GaSb, AlSb, InSb, Si, Ge, SiGe, SiC, graphene, carbon nanotubes, bucky balls, $Bi_2Te_3$, $Bi_2Se_3$, $Sb_2Te_3$, $Sb_2Se_3$, yttrium barium copper oxide (YBCO), bismuth strontium calcium copper oxide (BSCCO), HgBaCaCuO (HBCCO), FeAs, SmFeAs, CeFeAs, LaFeAs, MgB, or a combination thereof.

3. The nitride semiconductor light emitting device according to claim 2, wherein the rare earth element comprises Pr, Nd, Sm, Gd, Dy, or a combination thereof.

4. The nitride semiconductor light emitting device according to claim 1, wherein a material of the first magnetic material layer comprises Co, Fe, Ni, Mn, NiFe, CoFe, CoFeB, SmCo, NdFeB, formula $\Omega FeN$, formula $\Omega FeC$, $CrO_2$, $Fe_3O_4$, formula $La_{1-x}\Phi_x Mn$, formal $\Psi_2 \Delta \Sigma O_6$, GdN, NiMnSb, PtMnSb, $Fe_{1-x}Co_x Si$, $Fe_2 CrSi$, $Co_2 MnSi$, formula $Fe_2 \Theta Si$, $Cr_2 O_3$, $TbMnO_3$, $HoMn_2 O_5$, $HoLuMnO_3$, $YMnO_3$, $DyMnO_3$, $LuFe_2 O_4$, $BiFeO_3$, $BiMnO_3$, $BaTiO_3$, $PbVO_3$, $PrMnO_3$, $CaMnO_3$, $K_2 SeO_4$, $Cs_2 CdI_4$, $BaNiF_4$, $ZnCr_2 Se_4$, or a combination thereof, and wherein the $\Omega$ in formula $\Omega FeN$ and formula $\Omega FeC$ represents Ce, Pr, Nd, Sm, Eu, Tb, Dy, Ho, Er, Tm, or Yb; the $\Phi$ in formula $La_{1-x}\Phi_x Mn$ represents Ca, Ba, or Sr; x in formula $La_{1-x}\Phi_x Mn$ is about 0.3; the $\Psi$ in formula $\Psi_2 \Delta \Sigma O_6$ represents Ca, Sr, or B; the $\Delta$ in formula $\Psi_2 \Delta \Sigma O_6$ represents Co or Fe; the E in formula $\Psi_2 \Delta \Sigma O_6$ represents Mo or Re; the $\Theta$ in formula $Fe_2 \Theta Si$ represents Cr, Mn, Fe, Co, or Ni; x in $Fe_{1-x}Co_x Si$ is greater than 0 and less than 1.

5. The nitride semiconductor light emitting device according to claim 1, wherein a thickness of the first magnetic material layer in a direction perpendicular to the (0001) plane ranges from 20 nanometer (nm) to 1 micrometer (μm).

6. The nitride semiconductor light emitting device according to claim 1, wherein a material of the first magnetic material layer comprises Co doped ZnO, Mn doped ZnO, or a combination thereof.

7. The nitride semiconductor light emitting device according to claim 6, wherein the material of the first magnetic material layer is Co doped ZnO, and a doping concentration of Co in ZnO ranges from 2.5% to 20% by mole ratio.

8. The nitride semiconductor light emitting device according to claim 1, wherein the distribution area of the first magnetic material layer parallel to the (0001) plane of the n-type nitride semiconductor layer is greater than or equal to an area of the second metal pad parallel to the (0001) plane.

9. The nitride semiconductor light emitting device according to claim 1, wherein the first metal pad and the second metal pad are disposed on a same side of a semiconductor stack structure formed by the n-type nitride semiconductor layer, the light emitting semiconductor layer, and the p-type nitride semiconductor layer.

10. The nitride semiconductor light emitting device according to claim 1 further comprising a second magnetic material layer disposed between the second metal pad and the p-type nitride semiconductor layer, wherein a distribution area of the second magnetic material layer parallel to the (0001) plane of the n-type nitride semiconductor layer is greater than or equal to an area of the second metal pad parallel to the (0001) plane.

11. The nitride semiconductor light emitting device according to claim 10, wherein a material of the second magnetic material layer comprises Co doped ZnO, Mn doped ZnO, or a combination thereof.

12. The nitride semiconductor light emitting device according to claim 11, wherein the material of the second magnetic material layer is Co doped ZnO, and a doping concentration of Co in ZnO ranges from 2.5% to 9% by mole ratio.

13. The nitride semiconductor light emitting device according to claim 10, wherein a thickness of the second magnetic material layer in a direction perpendicular to the (0001) plane ranges from 20 nanometer (nm) to 0.6 micrometer (μm).

14. A nitride semiconductor light emitting device comprising:
   an n-type nitride semiconductor layer;
   a p-type nitride semiconductor layer;
   a light emitting semiconductor layer disposed between the n-type nitride semiconductor layer and the p-type nitride semiconductor layer;
   a first metal pad electrically connected to the n-type nitride semiconductor layer;
   a second metal pad electrically connected to the p-type nitride semiconductor layer; and
   a first magnetic material layer disposed between the first metal pad and the n-type nitride semiconductor layer, wherein a distribution area of the first magnetic material layer parallel to a (0001) plane of the n-type nitride semiconductor layer is greater than or equal to an area of the second metal pad parallel to the (0001) plane.

15. The nitride semiconductor light emitting device according to claim 14, wherein a material of the first magnetic material layer comprises a magnetic element doped compound, the magnetic element comprises a transition metal, a rare earth element, or a combination thereof, and the compound comprises $CuAlO_2$, $CuGaO_2$, $AgInO_2$, $SrCu_2O_2$, $Cd_2SnO_4$, $In_2O_3$, $TiO_2$, $Cu_2O$, ZnO, $SnO_2$, CdO, ZnO, MnSe, ZnSe, CdSe, MgSe, ZnTe, MnTe, MgTe, CdTe, CdS, ZnS, HgS, HgSe, HdTe, NiO, MnO, GaN, InN, AlN, InAs, GaAs, AlAs, GaP, InP, GaSb, AlSb, InSb, Si, Ge, SiGe, SiC, graphene, carbon nanotubes, bucky balls, $Bi_2Te_3$, $Bi_2Se_3$, $Sb_2Te_3$, $Sb_2Se_3$, yttrium barium copper oxide (YBCO), bismuth strontium calcium copper oxide (BSCCO), HBCCO, FeAs, SmFeAs, CeFeAs, LaFeAs, MgB, or a combination thereof.

16. The nitride semiconductor light emitting device according to claim 15, wherein the rare earth element comprises Pr, Nd, Sm, Gd, Dy, or a combination thereof.

17. The nitride semiconductor light emitting device according to claim 14, wherein a material of the first magnetic material layer comprises Co, Fe, Ni, Mn, NiFe, CoFe, CoFeB, SmCo, NdFeB, formula $\Omega FeN$, formula $\Omega FeC$, $CrO_2$, $Fe_3O_4$, formula $La_{1-x}\Phi_xMn$, formal $\Psi_2\Delta\rho O_6$, GdN, NiMnSb, PtMnSb, $Fe_{1-x}Co_xSi$, $Fe_2CrSi$, $Co_2MnSi$, formula $Fe_2\Theta Si$, $Cr_2O_3$, $TbMnO_3$, $HoMn_2O_5$, $HoLuMnO_3$, $YMnO_3$, $DyMnO_3$, $LuFe_2O_4$, $BiFeO_3$, $BiMnO_3$, $BaTiO_3$, $PbVO_3$, $PrMnO_3$, $CaMnO_3$, $K_2SeO_4$, $Cs_2CdI_4$, $BaNiF_4$, $ZnCr_2Se_4$, or a combination thereof, and wherein the $\Omega$ in formula $\Omega FeN$ and formula $\Omega FeC$ represents Ce, Pr, Nd, Sm, Eu, Tb, Dy, Ho, Er, Tm, or Yb; the $\Phi$ in formula $La_{1-x}\Phi_xMn$ represents Ca, Ba, or Sr; x in formula $La_{1-x}\Phi_xMn$ is about 0.3; the $\Psi$ in formula $\Psi_2\Delta\Sigma O_6$ represents Ca, Sr, or B; the $\Delta$ in formula $\psi_2\Delta\Sigma O_6$ represents Co or Fe; the $\Sigma$ in formula $\Psi_2\Delta\Sigma O_6$ represents Mo or Re; the $\Theta$ in formula $Fe_2\Theta Si$ represents Cr, Mn, Fe, Co, or Ni; x in $Fe_{1-x}Co_xSi$ is greater than 0 and less than 1.

18. The nitride semiconductor light emitting device according to claim 14, wherein a thickness of the first magnetic material layer in a direction perpendicular to the (0001) plane ranges from 20 nanometer (nm) to 1 micrometer (μm).

19. The nitride semiconductor light emitting device according to claim 14, wherein a material of the first magnetic material layer comprises Co doped ZnO, Mn doped ZnO, or a combination thereof.

20. The nitride semiconductor light emitting device according to claim 19, wherein the material of the first magnetic material layer is Co doped ZnO, and a doping concentration of Co in ZnO ranges from 2.5% to 20% by mole ratio.

21. The nitride semiconductor light emitting device according to claim 14, wherein the first metal pad and the second metal pad are disposed on a same side of a semiconductor stack structure formed by the n-type nitride semiconductor layer, the light emitting semiconductor layer, and the p-type nitride semiconductor layer.

22. The nitride semiconductor light emitting device according to claim 14 further comprising a second magnetic material layer disposed between the second metal pad and the p-type nitride semiconductor layer, wherein a distribution area of the second magnetic material layer parallel to the (0001) plane of the n-type nitride semiconductor layer is greater than or equal to an area of the second metal pad parallel to the (0001) plane.

23. The nitride semiconductor light emitting device according to claim 22, wherein a material of the second magnetic material layer comprises Co doped ZnO, Mn doped ZnO, or a combination thereof.

24. The nitride semiconductor light emitting device according to claim 23, wherein the material of the second magnetic material layer is Co doped ZnO, and a doping concentration of Co in ZnO ranges from 2.5% to 9% by mole ratio.

25. The nitride semiconductor light emitting device according to claim 22, wherein a thickness of the second magnetic material layer in a direction perpendicular to the (0001) plane ranges from 20 nanometer (nm) to 0.6 micrometer (μm).

26. A nitride semiconductor light emitting device comprising:
    an n-type nitride semiconductor layer;
    a p-type nitride semiconductor layer;
    a light emitting semiconductor layer disposed between the n-type nitride semiconductor layer and the p-type nitride semiconductor layer;
    a first metal pad electrically connected to the n-type nitride semiconductor layer;
    a second metal pad electrically connected to the p-type nitride semiconductor layer; and
    a magnetic material layer disposed between the second metal pad and the p-type nitride semiconductor layer, wherein a distribution area of the magnetic material layer parallel to a (0001) plane of the n-type nitride semiconductor layer is greater than or equal to an area of the second metal pad parallel to the (0001) plane.

27. The nitride semiconductor light emitting device according to claim 26, wherein the first metal pad and the second metal pad are disposed on a same side of a semiconductor stack structure formed by the n-type nitride semiconductor layer, the light emitting semiconductor layer, and the p-type nitride semiconductor layer.

28. The nitride semiconductor light emitting device according to claim 26, wherein a material of the magnetic material layer comprises Co doped ZnO, Mn doped ZnO, or a combination thereof.

29. The nitride semiconductor light emitting device according to claim 28, wherein the material of the magnetic material layer is Co doped ZnO, and a doping concentration of Co in ZnO ranges from 2.5% to 9% by mole ratio.

30. The nitride semiconductor light emitting device according to claim 26, wherein a thickness of the magnetic material layer in a direction perpendicular to the (0001) plane ranges from 20 nanometer (nm) to 0.6 micrometer (μm).

* * * * *